US012776757B2

(12) United States Patent
Rangineni et al.

(10) Patent No.: US 12,776,757 B2
(45) Date of Patent: Oct. 27, 2026

(54) SYSTEMS AND METHODS FOR PROVIDING SHUNT CANCELLATION OF PARASITIC COMPONENTS IN A PLASMA REACTOR

(71) Applicant: Lam Research Corporation, Fremont, CA (US)

(72) Inventors: Yaswanth Rangineni, Beaverton, OR (US); Sunil Kapoor, Vancouver, WA (US); Edward Augustyniak, Tualatin, OR (US); Yukinori Sakiyama, West Linn, OR (US)

(73) Assignee: Lam Research Corporation, Fremont, CA (US)

( * ) Notice: Subject to any disclaimer, the term of this patent is extended or adjusted under 35 U.S.C. 154(b) by 462 days.

(21) Appl. No.: 18/131,341

(22) Filed: Apr. 5, 2023

(65) Prior Publication Data

US 2023/0246624 A1 Aug. 3, 2023

Related U.S. Application Data

(63) Continuation of application No. 15/382,409, filed on Dec. 16, 2016, now abandoned.

(51) Int. Cl.
*H03H 7/38* (2006.01)
*C23C 16/455* (2006.01)
(Continued)

(52) U.S. Cl.
CPC ......... *H03H 7/38* (2013.01); *C23C 16/45536* (2013.01); *C23C 16/45544* (2013.01);
(Continued)

(58) Field of Classification Search
CPC ........... H01J 37/32899; H01J 37/32091; H01J 37/32174; H01J 37/32183; H03H 7/38;
(Continued)

(56) References Cited

U.S. PATENT DOCUMENTS 5,272,417 A * 12/1993 Ohmi .................. H01J 37/3266 156/914
9,306,533 B1 4/2016 Mavretic
(Continued)

FOREIGN PATENT DOCUMENTS

CN 101057310 A 10/2007
CN 102365717 A 2/2012
(Continued)

OTHER PUBLICATIONS

CN Office Action dated Jun. 23, 2021 in CN Application No. 201780086692.8, with English Translation.
(Continued)

*Primary Examiner* — Stephanie E Bloss
*Assistant Examiner* — Michael A Harrison
(74) *Attorney, Agent, or Firm* — Weaver Austin Villeneuve & Sampson LLP

(57) ABSTRACT

Systems and methods for negating an impedance associated with parasitic capacitance are described. One of the systems includes a plasma chamber having a housing. The housing includes a pedestal, a showerhead situated above the pedestal to face the pedestal, and a ceiling located above the showerhead. The system further includes a radio frequency (RF) transmission line coupled to the plasma chamber for transferring a modified RF signal to the showerhead. The system includes a shunt circuit coupled within a pre-determined distance from the ceiling. The shunt circuit is coupled to the RF transmission line for negating the impedance associated with the parasitic capacitance within the housing.

9 Claims, 22 Drawing Sheets

(51) Int. Cl.

| | |
|---|---|
| ***C23C 16/458*** | (2006.01) |
| ***C23C 16/505*** | (2006.01) |
| ***H01J 37/32*** | (2006.01) |

(52) U.S. Cl.
CPC ...... *C23C 16/45565* (2013.01); *C23C 16/458* (2013.01); *C23C 16/4583* (2013.01); *C23C 16/505* (2013.01); *H01J 37/32091* (2013.01); *H01J 37/32174* (2013.01); *H01J 37/32183* (2013.01); *H01J 37/32899* (2013.01)

(58) Field of Classification Search
CPC ........ C23C 16/45536; C23C 16/45565; C23C 16/45544; C23C 16/458; C23C 16/505; C23C 16/4583
See application file for complete search history.

(56) References Cited

U.S. PATENT DOCUMENTS

| | | | |
|---|---|---|---|
| 2005/0264218 A1 | 12/2005 | Dhindsa et al. | |
| 2007/0228009 A1 | 10/2007 | Yamazawa et al. | |
| 2008/0011424 A1 | 1/2008 | Yin et al. | |
| 2010/0193128 A1 | 8/2010 | Koumura et al. | |
| 2015/0348854 A1* | 12/2015 | Kapoor ............... | H01J 37/3244 |
| 2018/0175819 A1 | 6/2018 | Rangineni et al. | |

FOREIGN PATENT DOCUMENTS

| | | |
|---|---|---|
| CN | 103871810 A | 6/2014 |
| CN | 104185955 A | 12/2014 |
| CN | 105321792 A | 2/2016 |
| CN | 105887050 A | 8/2016 |
| CN | 105938785 A | 9/2016 |
| KR | 20060050031 A | 5/2006 |
| KR | 20110126675 A | 11/2011 |
| KR | 20140078573 A | 6/2014 |
| KR | 20140133475 A | 11/2014 |
| KR | 20150139461 A | 12/2015 |
| KR | 20160046748 A | 4/2016 |
| KR | 20160136239 A | 11/2016 |
| WO | WO-2018111598 A1 | 6/2018 |

OTHER PUBLICATIONS

CN Office Action dated Mar. 24, 2022 in CN Application No. 201780086692.8, with English Translation.

CN Office Action dated May 26, 2026 in CN Application No. 202311021015.1, with English Translation.

CN Office Action dated Nov. 3, 2022 in CN Application No. 201780086692.8, with English Translation.

International Preliminary Report on Patentability and Written Opinion dated Jun. 27, 2019, in PCT Application No. PCT/US2017/064519.

KR Notice of Allowance dated Jun. 1, 2023 in KR Application No. 10-2023-7012855, with English Translation.

KR Notice of Allowance dated Nov. 19, 2025 in KR Application No. 10-2023- 7029920, with English Translation.

KR Office Action dated Dec. 27, 2021 in KR Application No. 10-2019-7020094, with English Translation.

KR Office Action dated Jan. 24, 2025 in KR Application No. 10-2023-7029920, with English Translation.

KR Office Action dated Jul. 19, 2022 in KR Application No. 10-2019-7020094, with English Translation.

KR Office Action dated May 20, 2024 in KR Application No. 10-2023-7029920, with. English Translation.

U.S. Final Office Action dated Apr. 11, 2022 in U.S. Appl. No. 15/382,409.

U.S. Final Office Action dated Aug. 6, 2020 in U.S. Appl. No. 15/382,409.

U.S. Final Office Action dated Feb. 10, 2023 in U.S. Appl. No. 15/382,409.

U.S. Final Office Action dated Jun. 14, 2021 in U.S. Appl. No. 15/382,409.

U.S. Non-Final Office Action dated Dec. 7, 2020 in U.S. Appl. No. 15/382,409.

U.S. Non-Final Office Action dated Jan. 30, 2020 in U.S. Appl. No. 15/382,409.

U.S. Non-Final Office Action dated Jul. 25, 2022 in U.S. Appl. No. 15/382,409.

U.S. Non-Final Office Action dated Oct. 22, 2021 in U.S. Appl. No. 15/382,409.

* cited by examiner

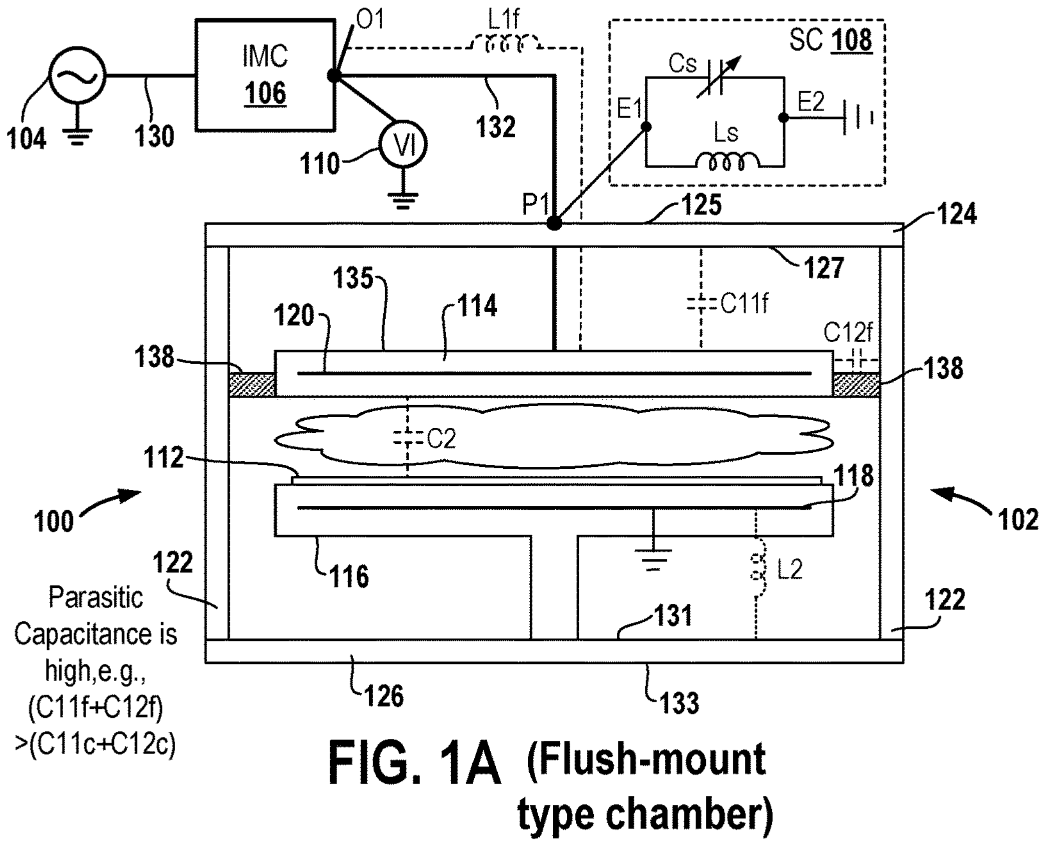
FIG. 1A (Flush-mount type chamber)
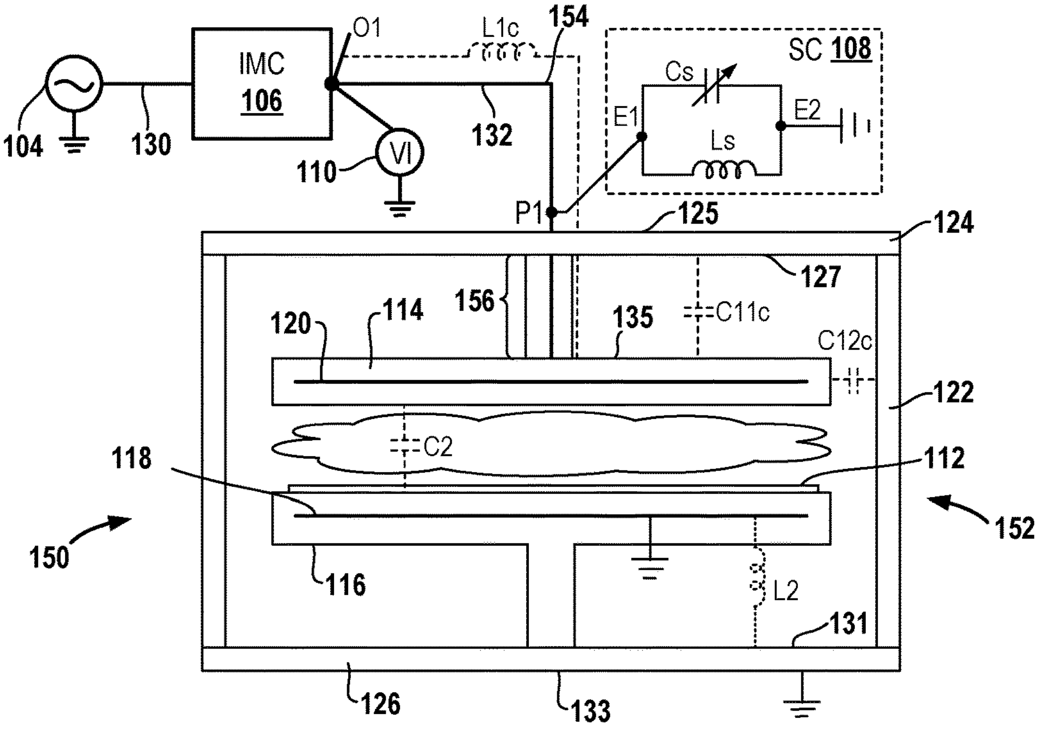
FIG. 1B (Chandelier-type showerhead)

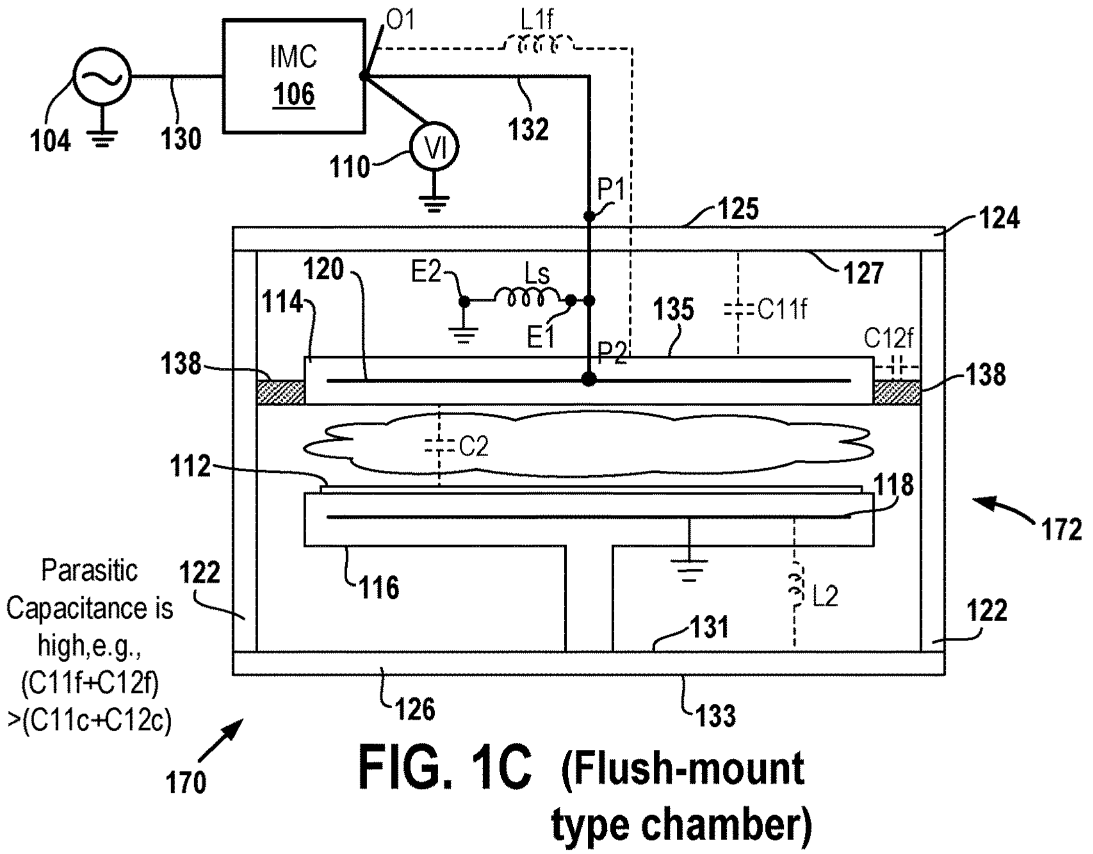
FIG. 1C (Flush-mount type chamber)
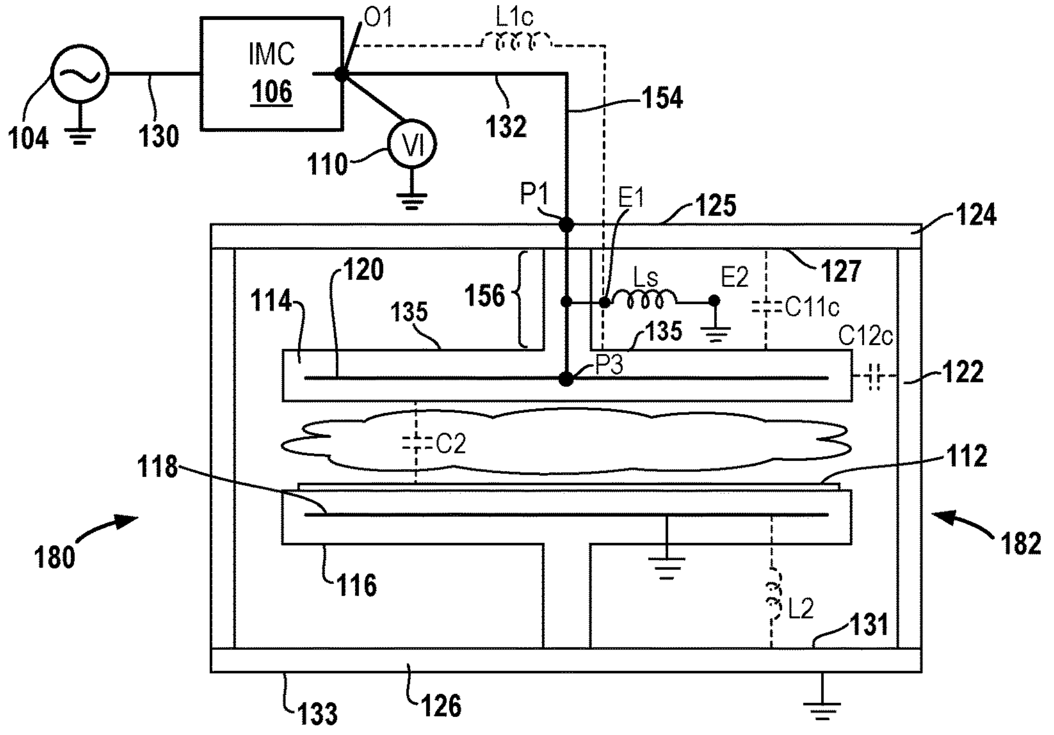
FIG. 1D (Chandelier-type showerhead)

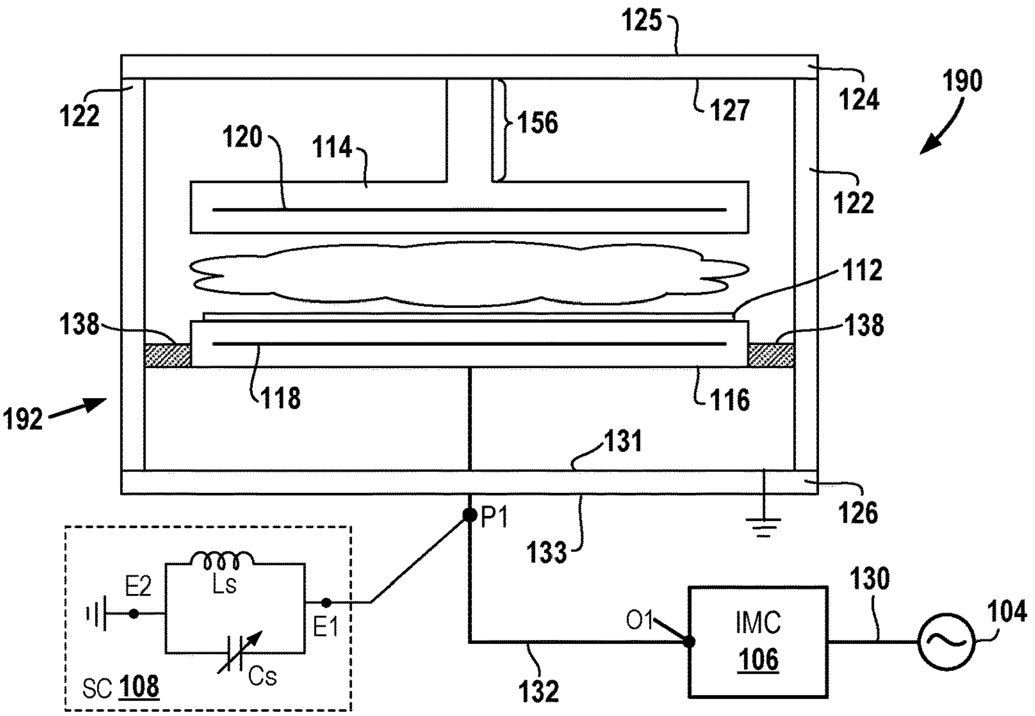
FIG. 1E (Flush-mount type chamber)
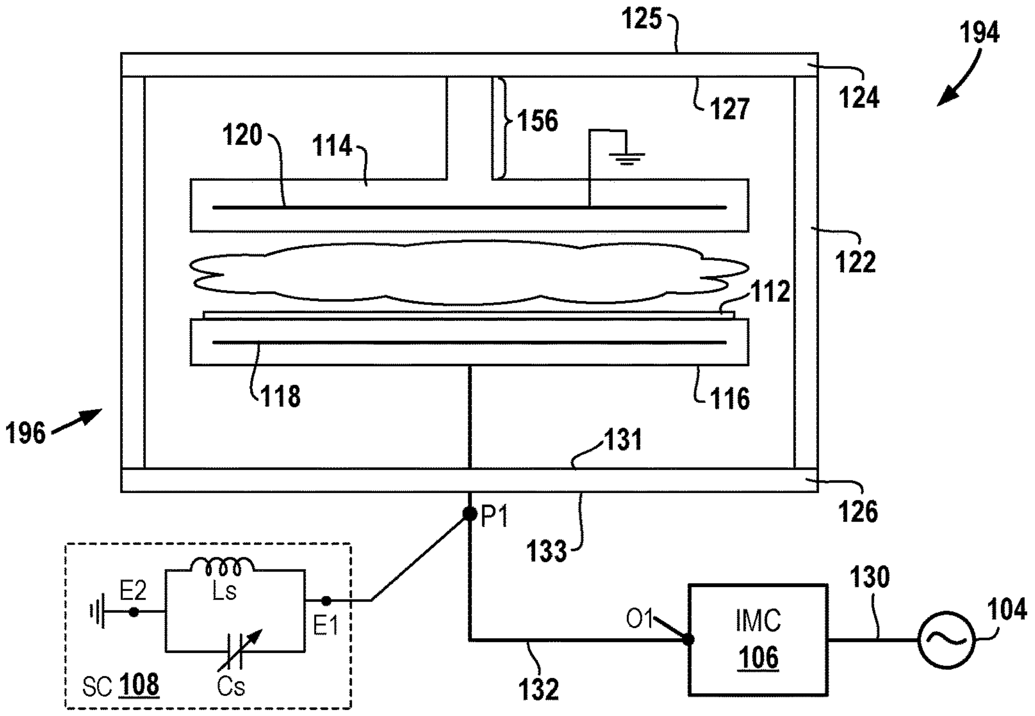
FIG. 1F (Chandelier-type chamber)

VI Probe readings

660

| Column 1 | Column 2 | Column 3 | Column 4 |
|---|---|---|---|
| | No Cancellation | With cancellation, adj cap at 4pF | With cancellation adj cap at 70pF |
| Voltage(v) | 93 | 268 | 257 |
| Current(A) | 27 | 7.2 | 9.5 |
| Phase(Deg) | -81 | -70 | -74 |
| Power(W) | 400 | 694 | 674 |

820

Circuit Not Installed

| | Voltage (V) | Current (A) | Phase (deg) | Power (W) |
|---|---|---|---|---|
| Stn-1 | 95 | 23.1 | -77 | 461 |
| Stn-2 | 93 | 23 | -79 | 406 |
| Stn-3 | 76 | 22.8 | -76 | 425 |
| Stn-4 | 84 | 23.5 | -78 | 413 |

FIG. 8C

840

Circuit Installed, Before Balancing

| | Voltage (V) | Current (A) | Phase (deg) | Power (W) |
|---|---|---|---|---|
| Stn-1 | 248 | 13 | -76 | 786 |
| Stn-2 | 247 | 13 | -77 | 700 |
| Stn-3 | 201 | 12.1 | -78 | 473 |
| Stn-4 | 207 | 12.5 | -79 | 457 |

Power Not Balanced

FIG. 8D

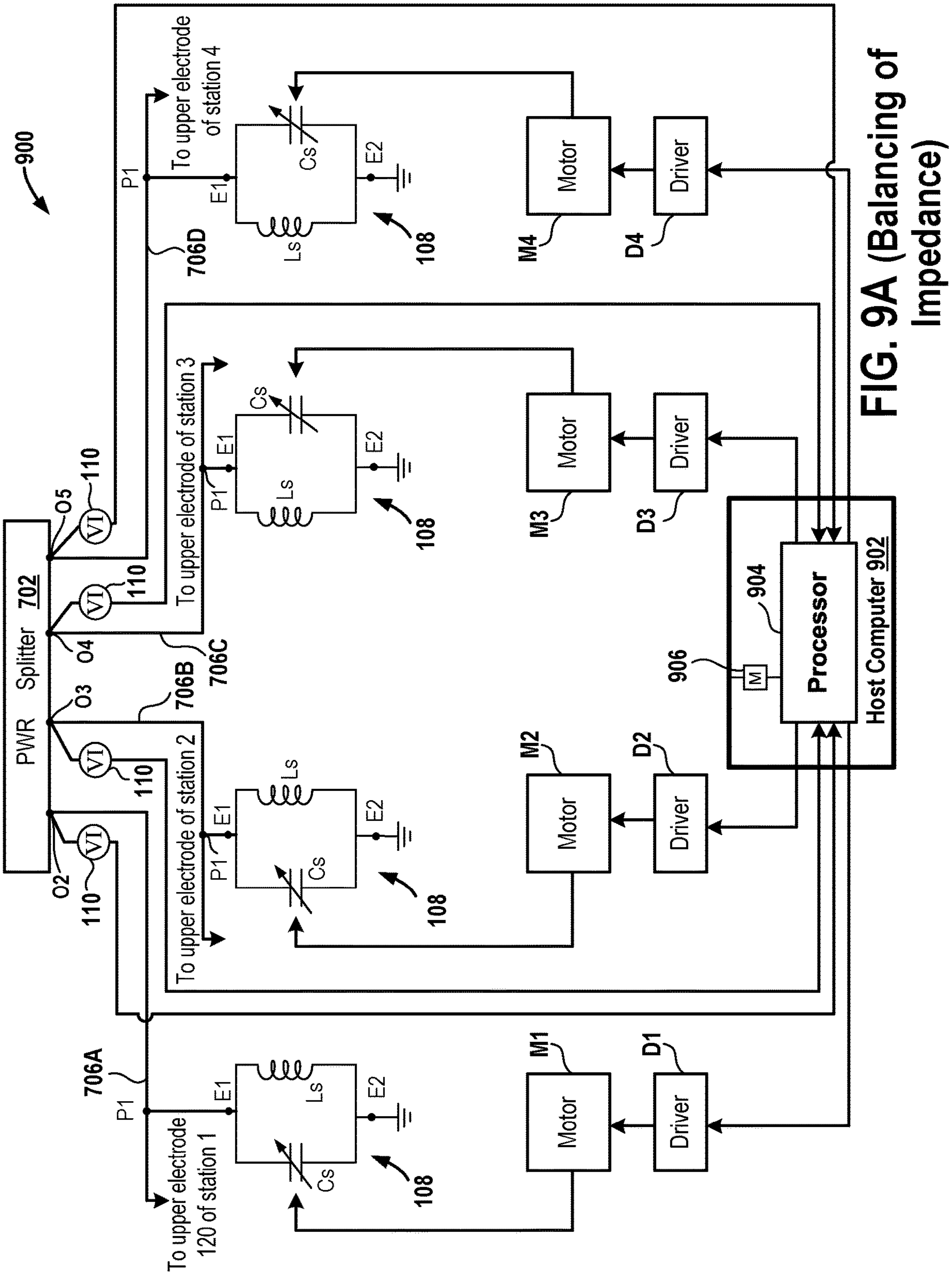
FIG. 9A (Balancing of Impedance)

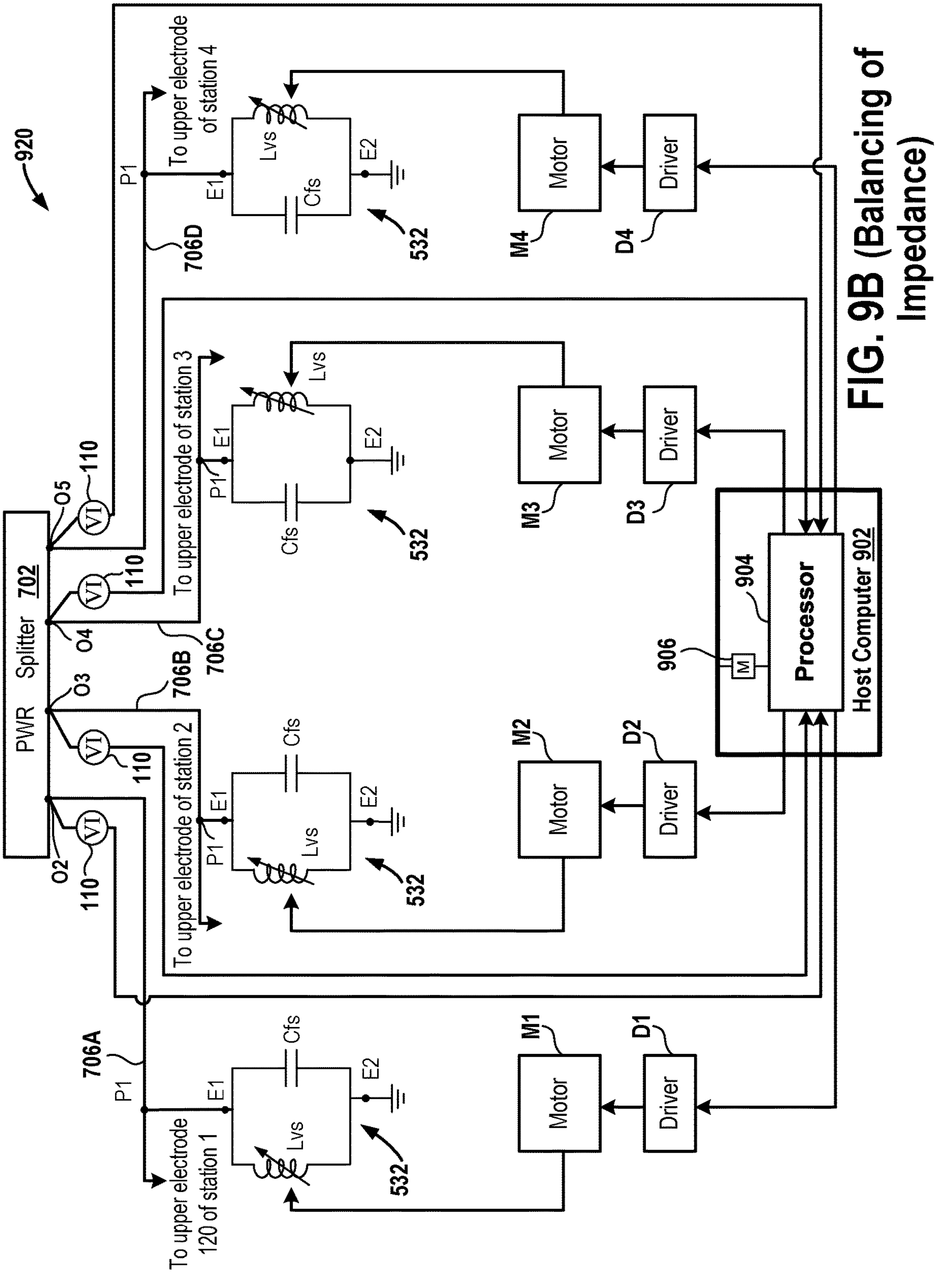
FIG. 9B (Balancing of Impedance)

1000

1020

After Balancing

| | Voltage (V) | Current (A) | Phase (deg) | Power (W) |
|---|---|---|---|---|
| Stn-1 | 235 | 13.3 | -79 | 593 |
| Stn-2 | 239 | 13.5 | -79 | 588 |
| Stn-3 | 217 | 13 | -78 | 576 |
| Stn-4 | 223 | 13.5 | -79 | 580 |

Balanced Power

FIG. 10B

SYSTEMS AND METHODS FOR PROVIDING SHUNT CANCELLATION OF PARASITIC COMPONENTS IN A PLASMA REACTOR

CLAIM OF PRIORITY

The present patent application is a continuation of and claims the benefit of and priority, under 35 U.S.C. § 120, to U.S. patent application Ser. No. 15/382,409, filed on Dec. 16, 2016, and titled "SYSTEMS AND METHODS FOR PROVIDING SHUNT CANCELLATION OF PARASITIC COMPONENTS IN A PLASMA REACTOR", which is incorporated by reference herein in its entirety.

FIELD

The present embodiments relate to systems and methods for providing shunt cancellation of parasitic components in a plasma reactor.

BACKGROUND

Generally, process reactors are used to process operations upon wafers, e.g., silicon wafers. These wafers are typically processed numerous times in various reactors in order to form integrated circuits thereon. Some of these process operations involve, for instance, depositing materials over select surfaces or layers of a wafer. One such reactor is a plasma enhanced chemical vapor deposition (PECVD) reactor.

For example, a PECVD reactor may be used to deposit insulation films such as silicon oxide (SiO), silicon nitride (SiN), silicon carbide (SiC), silicon oxycarbide (SiOC), and others. Such material films may include an aluminum (Al) alloy. Depending on the type of film being deposited, specific reaction gases are brought into the PECVD reactor while radio frequency (RF) power is supplied to produce plasma that enables the deposition. The RF power is generated by an RF generator and provided via a matchbox to an electrode of the PECVD reactor. However, the RF power delivered to the electrode is reduced.

It is in this context that embodiments described in the present disclosure arise.

SUMMARY

Embodiments of the disclosure provide systems and methods for providing shunt cancellation of parasitic components in a plasma reactor. It should be appreciated that the present embodiments can be implemented in numerous ways, e.g., a process, an apparatus, a system, a device, or a method on a computer-readable medium. Several embodiments are described below.

Plasma enhanced chemical vapor deposition (PECVD) and atomic layer deposition (ALD) chambers are classified into two types, such as, chandelier-type and flush-mount type. The chandelier-type chamber has a radio frequency (RF) powered electrode physically detached from a chamber wall and the RF powered electrode is suspended by a stem that extends from a ceiling of a housing of the chandelier-type chamber. In the flush-mount type chamber, the RF powered electrode is supported around its periphery with fastening hardware that electrically insulates the RF powered electrode from a ground potential of the flush-mount type chamber. In these types of chambers, there is non-zero parasitic capacitance between the RF powered electrode and the housing. The parasitic capacitance of flush-mount type chamber is higher than that in the chandelier-type chamber, e.g., by a factor of 3 to 5.

When RF power is applied to the flush-mount type chamber, displacement current flows through the parasitic capacitance and RF power is not effectively coupled to a wafer situated on a pedestal of the flush-mount type chamber. The ineffectively coupled RF power causes very low or no deposition on the wafer. Also, RF components, such as a showerhead, of the flush-mount type chamber receive high RF currents due to the parasitic capacitance that is present in parallel to the RF powered electrode. RF delivery hardware, such as coax cables and matching networks, cannot easily handle the high RF currents without increasing design and hardware costs associated with the flush-mount type chamber.

In various embodiments, a shunt cancellation RF circuit is added to a capacitively-coupled plasma (CCP) reactor, e.g., the flush-mount type chamber, the chandelier-type chamber, etc., to compensate for the parasitic capacitance. The shunt cancellation RF circuit minimizes parasitic RF coupling and maximizes power coupled to the wafer to increase a deposition rate of depositing materials on the wafer. Also, due to suppression of parasitic RF current paths by the shunt cancellation RF circuit, an input RF current to the showerhead is reduced. The RF current paths, in some embodiments, are paths created by the parasitic capacitance.

In several embodiments, a system for negating, e.g., nullifying, reducing, etc., an impedance associated with the parasitic capacitance is described. The system includes a plasma chamber having a housing. The housing includes a pedestal, a showerhead situated above the pedestal to face the pedestal, and a ceiling located above the showerhead. The system further includes an RF transmission line coupled to the plasma chamber for transferring a modified RF signal to the showerhead. The system includes a shunt circuit coupled within a pre-determined distance from the ceiling. The shunt circuit is coupled to the RF transmission line for negating the impedance associated with the parasitic capacitance within the housing.

In some embodiments, a shunt circuit is described. The shunt circuit includes a variable capacitor and an inductor coupled in parallel with the variable capacitor to form a first end and a second end. The first end is coupled to an RF transmission line coupled between an impedance matching circuit and a showerhead of a plasma chamber. The second end is coupled to a housing of the plasma chamber. The variable capacitor and the inductor negate an impedance associated with the parasitic capacitance within the housing.

In various embodiments, a multi-station processing tool is described. The multi-station processing tool includes an RF generator configured to generate an RF signal. The multi-station processing tool further includes an impedance matching circuit coupled to the RF generator to receive the RF signal to output a modified RF signal and a power splitter coupled to the impedance matching circuit to distribute power of the modified RF signal to output a plurality of modified RF output signals. The multi-station processing tool includes a first station coupled to a first output of the power splitter via a first RF transmission line to receive a first one of the modified RF output signals. The multi-station processing tool also includes a second station coupled to a second output of the power splitter via a second RF transmission line to receive a second one of the modified RF output signals. The multi-station processing tool includes a first shunt circuit coupled to the first RF transmission line to negate an impedance associated with a parasitic capacitance associated with the first station. The multi-station processing tool includes a second shunt circuit coupled to the second RF transmission line to negate an impedance associated with a parasitic capacitance associated with the second station.

Several advantages of the systems and methods for providing shunt cancellation of parasitic components in a plasma reactor include an increased efficiency of RF power delivered to a gap between the showerhead and the pedestal. For example, a shunt RF circuit deceases coupling of RF to the chamber wall and makes a load, e.g., the PECVD chamber, the ALD chamber, etc., less capacitive. The RF current input to the plasma reactor decreases and power lost in the RF components decreases. To illustrate, power delivered to the plasma reactor increases from 55% to 85% of setpoint power, which is power supplied by an RF generator. The increase in power results in higher deposition rates, which results in a higher efficiency in processing wafers.

Additional advantages of the herein described systems and methods for providing shunt cancellation of parasitic components in a plasma reactor include station-to-station matching and reduced cost of RF hardware due to reduction, e.g., elimination, of the RF current paths. For instance, a total current to the RF powered electrode drops from 26 amperes to 9.5 amperes when a shunt circuit is used. The low total current decreases a risk of station-to-station variation that is caused by a small variation of parasitic capacitance between the stations. Also, the low total current means that the RF hardware need not be designed to handle high currents.

Further advantages of the herein described systems and methods for providing shunt cancellation of parasitic components in a plasma reactor include an increase in accuracy of RF power measurement. For instance, a phase of RF power measured is −82° without a shunt circuit. When the phase of RF power is close to −90°, an accuracy of metrology decreases. With the shunt circuit installed, the phase measured is −68°. As a result, an accuracy of measurement improves, which makes troubleshooting easier.

Other aspects will become apparent from the following detailed description, taken in conjunction with the accompanying drawings.

BRIEF DESCRIPTION OF THE DRAWINGS

The embodiments may best be understood by reference to the following description taken in conjunction with the accompanying drawings.

FIG. 1A is a diagram of an embodiment of a plasma processing system to illustrate use of a shunt circuit with a flush-mount type plasma chamber.

FIG. 1B is a diagram of an embodiment of a plasma processing system to illustrate use of a shunt circuit with a chandelier-type plasma chamber.

FIG. 1C is a diagram of an embodiment of a plasma processing system in which a shunt circuit is situated within a housing of the flush-mount type plasma chamber.

FIG. 1D is a diagram of an embodiment of a plasma processing system in which a plasma chamber includes a shunt circuit within a housing of the chandelier-type plasma chamber.

FIG. 1E is a diagram of an embodiment of a plasma processing system to illustrate a coupling of a shunt circuit to a point on a radio frequency (RF) transmission line that is coupled to a bottom electrode of a flush-mount type plasma chamber instead of a top electrode of the flush-mount type plasma chamber.

FIG. 1F is a diagram of an embodiment of a plasma processing system to illustrate a coupling of a shunt circuit to a point on an RF transmission line that is coupled to a bottom electrode of a chandelier-type plasma chamber instead of a top electrode of the chandelier-type plasma chamber.

FIG. 8C is an embodiment of a table to illustrate an amount of voltage associated with parasitic capacitance at each of the stations when a shunt circuit is not used with any of the stations.

FIG. 8D is an embodiment of a table to illustrate a change in voltages, currents, phases, and power when a shunt circuit is used at the stations.

FIG. 9A is a diagram of an embodiment of a multi-station system for negating impedances associated with parasitic capacitances of the stations by modifying capacitances of capacitors of shunt circuits associated with the stations.

FIG. 9B is a diagram of an embodiment of a multi-station system for negating impedances associated with parasitic capacitances of the stations by changing inductances of inductors of shunt circuits used with the stations.

FIG. 10B is an embodiment of a table to illustrate balancing of power at the stations.

DETAILED DESCRIPTION

Figure 1G:
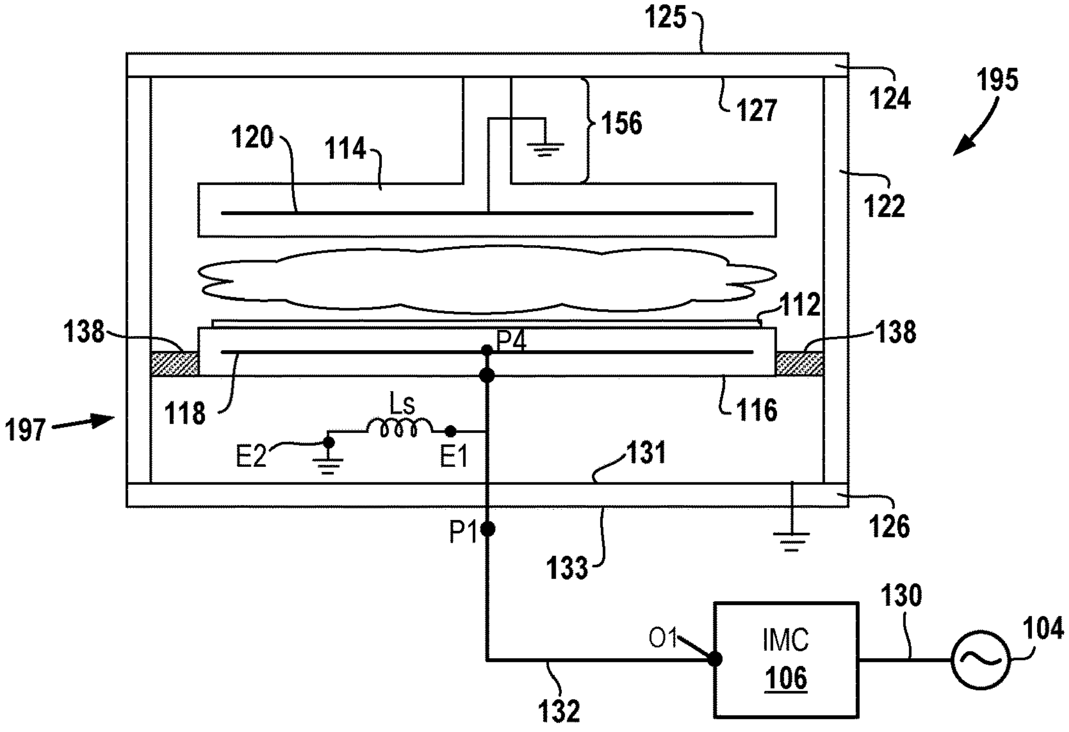
FIG. 1G is a diagram of an embodiment of a plasma processing system to illustrate use of a shunt circuit within a housing of the flush-mount type plasma chamber of FIG. 1E to negate an impedance associated with parasitic capacitance of the flush-mount type plasma chamber.

The following embodiments describe systems and methods for providing shunt cancellation of parasitic components in a plasma reactor. It will be apparent that the present embodiments may be practiced without some or all of these specific details. In other instances, well known process operations have not been described in detail in order not to unnecessarily obscure the present embodiments.

Deposition of films is preferably implemented in a plasma enhanced chemical vapor deposition (PECVD) system or an atomic layer deposition (ALD) chamber. The PECVD system may take many different forms. The PECVD system includes one or more plasma chambers or “reactors” (sometimes including multiple stations) that house one or more wafers and are suitable for wafer processing. Each plasma chamber houses one or more wafers for processing. The one or more plasma chambers maintain a wafer in a defined position or positions with or without motion, e.g. rotation, vibration, or other agitation, etc., within that position. The wafer undergoing deposition is transferred from one station to another during a process. The film deposition occurs entirely at a single station or any fraction of the film is deposited at any number of stations. While in process, each wafer is held in place by a pedestal, e.g., a wafer chuck, etc., and/or other wafer holding apparatus of the plasma chamber.

A capacitively coupled plasma (CCP) reactor, e.g., the ALD chamber, the PECVD chamber, etc., has an inherent parasitic capacitance between a showerhead, which includes a radio frequency (RF) powered electrode, and a chamber wall, which is grounded. In some cases, due to geometry of the CCP reactor and the RF powered electrode, this parasitic capacitance is so high that RF current through the parasitic capacitance is higher than RF current through a wafer processing cavity, which is a gap between the showerhead and the pedestal of the CCP reactor. The high parasitic coupling decreases delivered RF power used for processing the wafer. As a result, a deposition rate of depositing materials on the wafer reduces.

One solution is to increase the RF current that is supplied to the wafer processing cavity. For example, an RF hardware system is sometimes used to handle the high RF current. However, the RF hardware system is cost-prohibitive.

In some embodiments, a shunt RF circuit is added to the CCP reactor to counter, e.g., cancel, the parasitic capacitance and make the CCP reactor resonate at an applied frequency. For example, when an inductor is coupled to an RF transmission line coupled to the RF powered electrode located above a gas distribution plate (GDP), the parasitic capacitance is reduced. The GDP has multiple through holes for transferring one or more processing gases for processing the wafer. In addition, by adding an adjustable capacitor parallel to the inductor, an inductance of the inductor is tuned to reduce the parasitic capacitance to null or close to zero and resonate the CCP reactor at a frequency of operation e.g., 13.56 megahertz (MHz), 400 kilohertz, 2 megahertz, 60 megahertz, 27.12 megahertz. In this manner, RF power delivered to the wafer processing cavity is maximized.

FIG. 1A is a diagram of a plasma processing system 100 to illustrate a flush-mount type plasma chamber 102. The plasma processing system 100 includes an RF generator 104, an impedance matching circuit (IMC) 106, a shunt circuit 108, and a voltage and current (VI) probe 110, which is optional.

The plasma chamber 102 includes a showerhead 114 and a pedestal 116. The pedestal 116 has embedded within it a bottom electrode 118. Also, the showerhead 114 has embedded within it a top electrode 120. For example, the top electrode 120 is surrounded by an insulator, e.g., ceramic. Each of the top electrode 120 and the bottom electrode 118 is made of a metal, e.g., molybdenum, alloy of molybdenum, etc. The showerhead 114 faces the pedestal 116 and is located opposite the pedestal 116. The plasma chamber 102 has a housing, which is made of a side wall 122, a ceiling 124, and a bottom portion 126. In various embodiments, the ceiling 124 is referred to herein as a chamber top plate. The showerhead 114, the pedestal 116, and a side mount 138 are located within the housing. The side mount 138 is further described below. In various embodiments, the bottom portion 126 is referred to herein as a chamber bottom plate. For example, under the chamber bottom plate, vacuum pumps are located for evacuating remnants, e.g., one or more process gases, of processing a wafer 112 from the housing.

In some embodiments, the side wall 122 has a circular shape or an oval shape. In various embodiments, the side wall 122 is formed of four rectangular or square shape sides. To illustrate, the side wall 122 has a first side, a second side adjacent to and connected to the first side, a third side adjacent to and connected to the second side, and a fourth side adjacent to and connected to the third side and adjacent to and connected to the first side.

The ceiling 124 has a top surface 125 and a bottom surface 127. The bottom surface 127 faces a top surface 135 of the showerhead 114 and the top surface 125 of the ceiling 124 faces the shunt circuit 108. The bottom surface 127 of the ceiling 124 does not face the shunt circuit 108. The bottom portion 126 is located opposite to the ceiling 124 and faces the ceiling 124. The side wall 122 is adjacent to and connected to the ceiling 124 and is adjacent to and connected to the bottom portion 126. The housing of the plasma chamber 102 is coupled to a ground potential. The showerhead 114 is coupled to the side wall 122 via the side mount 138. For example, the showerhead 114 is anchored to the side wall 122 via the side mount 138 so that the side wall 122 supports the showerhead 114. The side mount 138 is made of one or more electrically insulating materials, e.g., ceramic. In some embodiments, any number of side mounts connects the showerhead 114 to the side wall 122.

The RF generator 104 is coupled to the IMC 106 via an RF cable 130 and the IMC 106 is coupled to the plasma chamber 102 via an RF transmission line 132, e.g., a coaxial cable. An inductance of the RF transmission line 132 is represented as L1*f*. The RF transmission line 132 extends through the ceiling 124, e.g., via a hole in the ceiling 124, into the housing to connect to the top electrode 120.

The plasma chamber 102 is a capacitively-coupled plasma (CCP) chamber and is an example of the PECVD system used to process a wafer 112. Examples of the RF generator 104 include a 400 kilohertz (kHz) RF generator, a 2 megahertz (MHz) RF generator, a 13.56 MHz RF generator, a 27.12 MHz RF generator, a 60 MHz RF generator. The RF generator 104 includes an RF power supply, e.g., an RF oscillator, for generating an RF signal.

The IMC 106 is a network of circuit elements, e.g., resistors, capacitors, inductors, etc., that match an impedance of a load connected to an output O1 of the IMC 106 with an impedance of a source connected to one or more inputs of the IMC 106. For example, the IMC 106 matches an impedance of the RF transmission line 132 and the plasma chamber 102 with that of the RF cable 130 and the RF generator 104. Examples of the VI probe 110 include a complex voltage and current sensor, a voltage sensor, a current sensor, a power sensor, an impedance sensor, etc.

The RF transmission line 132 is coupled to the shunt circuit 108 at a point P1, which is located a pre-determined distance from the ceiling 124. For example, the shunt circuit 108 is located above the ceiling 124 and is connected to the RF transmission line 132 at the point P1 immediately before the RF transmission line 132 extends via the ceiling 124 into the housing of the plasma chamber 102. As another example, the shunt circuit 108 is supported by the ceiling 124 and is placed on the top surface 125 of the ceiling 124 to be supported by the ceiling 124. As yet another example, the shunt circuit 108 is located inside the plasma chamber 102 and is supported by the bottom surface 127 of the ceiling 124.

The shunt circuit 108 includes a capacitor Cs and an inductor Ls. An example value of the capacitor Cs is 4 picoFarad (pF). Another example value of the capacitor Cs is 70 pF. As yet another example, a value of the capacitor Cs varies between 4 pF and 70 pF. An example value of the inductor Ls is 0.2 microHenry. Another example value of the inductor Ls is 0.4 microHenry. As yet another example, a value of the inductor Ls varies between 0.2 and 0.4 microHenry. The inductor Ls is coupled in parallel to the capacitor Cs. The inductor Ls is coupled to the capacitor Cs at one end E1, which is connected to the point P1 on the RF transmission line 132. Moreover, the inductor Ls is coupled to the capacitor Cs at another end E2 opposite to the end E1, and the end E2 is coupled to the ground potential. In some embodiments, the end E2 is coupled to the ground potential by connecting the end E2 to the top surface 125 of the ceiling 124, which is also coupled to the ground potential. The VI probe 110 is coupled to the output O1 of the IMC 106.

The RF power supply of the RF generator 104 generates an RF signal, which is transferred via the RF cable 130 to the IMC 106. The IMC 106 matches an impedance of the load with that of the source to generate a modified RF signal at its output O1. The modified RF signal is transferred via the RF transmission line 132 via the point P1 to the top electrode 120 of the showerhead 114. Moreover, the bottom electrode 118 is coupled to the ground potential. For example, the bottom electrode 118 is coupled to the ground potential of the housing of the plasma chamber 102 via an RF strap. The RF strap has an inductance, which is illustrated by an inductor L2. Simultaneous with the supply of the modified RF signal to the top electrode 120, one or more process gases are supplied to the showerhead 114 to further be supplied to a gap between the pedestal 116 and the showerhead 114 to generate or maintain plasma within the gap. When the modified RF signal is provided to the top electrode 120 and the bottom electrode 118 is coupled to ground, plasma is created or maintained in the gap. The plasma is represented by a series combination of a capacitance and a resistance. The capacitance between the showerhead 114 and the pedestal 116 is illustrated by a capacitor C2 when plasma is absent. The capacitance between the showerhead 114 and the pedestal 116 represents the gap between the showerhead 114 and the pedestal 116. The plasma is used to process the wafer 112 situated on a top surface of the pedestal 116.

The layout of the showerhead 114 and the ceiling 124, e.g., a distance between the top surface 135 of the showerhead 114 and the ceiling 124, creates a parasitic capacitance C11*f* between the top surface 135 of the showerhead 114 and the ceiling 124. Moreover, a layout of the showerhead 114 and the side wall 122, e.g., a distance between a side surface of the showerhead 114 and the side wall 122, creates another parasitic capacitance C12*f* between the showerhead 114 and the side wall 122. The side surface of the showerhead 114 faces the side wall 122 and is adjacent to the top surface 135 of the showerhead 114. The top surface 135 of the showerhead 114 faces the ceiling 124. The top surface 135 of the showerhead 114 is opposite to a bottom surface of the showerhead 114 and the bottom surface of the showerhead 114 faces the gap between the showerhead 114 and the pedestal 116.

The parasitic capacitance C11*f* creates a low impedance path between the top surface 135 of the showerhead 114 and the ceiling 124 and the parasitic capacitance C12*f* creates a low impedance path between the side surface of the showerhead 114 and the side wall 122. Some RF current of the modified RF signal flows from the top surface 135 of the showerhead 114 to the ceiling 124 via the low impedance path having the parasitic capacitance C1 if and some RF power of the modified RF signal passes from the side surface of the showerhead 114 to the side wall 122 via the low impedance path having the parasitic capacitance C12*f*. As a result of the low impedance paths created by the parasitic capacitances C11*f* and C12*f*, when the shunt circuit 108 is not used, a higher amount of current is to be generated by the RF generator 104 and supplied to the top electrode 120 via the IMC 106 and the RF transmission line 132. Moreover, the low impedance paths created by the parasitic capacitances C11*f* and C12*f* reduces effectiveness in processing the wafer 112. For example, a deposition rate of depositing materials on the wafer 112 or a rate of cleaning the wafer 112 is reduced due to the low impedance paths.

The shunt circuit 108 increases impedances of the low impedance paths created by the parasitic capacitances C11*f* and C12*f* so that RF voltage of the modified RF signal that is transferred via the RF transmission line 132 to the top electrode 120 to generate or maintain the plasma within the gap is increased. For example, the impedances, in total, are increased from 5 ohms to 150 ohms. By controlling a capacitance of the capacitor Cs, or an inductance of the inductor Ls, or both, the impedances of the low impedance paths are increased. For example, the capacitance of the capacitor Cs, or the inductance of the inductor Ls, or both are changed manually or electrically. To illustrate, a person changes a distance between parallel plates of the capacitor Cs or an area between the two plates by rotating one of the plates with respect to another one of the plates. As another example, a person replaces a first core surrounded by coil turns of the inductor Ls with a second core to change permeability of the inductor Ls to change inductance of the inductor Ls. As yet another example, a person displaces an amount by which the core of the inductor Ls is surrounded by coil windings of the inductor Ls to change inductance of the inductor Ls. Impedances associated with the parasitic capacitances C11*f* and C12*f* are negated by increasing the impedances of the low impedance paths. For example, the impedances associated with the parasitic capacitances C11*f* and C12*f* are low. With the use of the shunt circuit 108, the low impedances are negated by increasing the low impedances.

In some embodiments, the IMC 106 has multiple inputs with each input coupled via an RF cable to a different RF generator. For example, a first input of the IMC 106 is connected via a first RF cable to a 400 kHz RF generator and a second input of the IMC 106 is connected via a second RF cable to a 13.56 MHz RF generator. As another example, a first input of the IMC 106 is connected via a first RF cable to a 2 MHz RF generator, a second input of the IMC 106 is connected via a second RF cable to the 13.56 MHz RF generator, and a third input of the IMC 106 is connected via a third RF cable to a 60 MHz RF generator.

In various embodiments, instead of the top electrode 120 being coupled to the IMC 106, the top electrode 120 is coupled to the ground potential and the bottom electrode 118 is coupled to the IMC 106 via the RF transmission line 132. The IMC 106 is coupled to the RF generator 104 via the RF cable 130. The shunt circuit 108 is coupled to the point P1 on the RF transmission line 132 coupled to the bottom electrode 118. The point P1 is located within the pre-determined distance below a bottom surface 133 of the bottom portion 126. The end E2 of the shunt circuit 108 is coupled to the ground potential by being coupled within the pre-determined distance from the bottom portion 126. For example, the shunt circuit 108 is located below the bottom portion 126 and the end E2 of the shunt circuit 108 is coupled to the bottom surface 133 of the bottom portion 126. The bottom portion 126 has a top surface 131, which faces the pedestal 116. The bottom surface 133 does not face the pedestal 116 and faces the shunt circuit 108.

In some embodiments, a top electrode of a showerhead of a plasma chamber is exposed to the gap and is not encapsulated within the insulator. For example, instead of the top electrode 120 being encapsulated in the insulator, another top electrode, e.g., an electrode fabricated from aluminum, an electrode fabricated from an alloy of aluminum, etc., is used, and the other electrode is not encapsulated within the insulator.

FIG. 1B is a diagram of an embodiment of a plasma processing system 150 in which a chandelier-type plasma chamber 152 is used instead of the flush-mount type plasma chamber 102 (FIG. 1A). The plasma processing system 150 includes the plasma chamber 152, the RF generator 104, the RF cable 130, the IMC 106, an RF transmission line 154, and the shunt circuit 108. The plasma chamber 152 is the same as the plasma chamber 102 except that the plasma chamber 152 includes a stem 156. The showerhead 114, the pedestal 116, and the stem 156 are located within the housing of the plasma chamber 152. The top surface 135 of the showerhead 114 is adjacent to the stem 156 and faces the ceiling 124.

The showerhead 114 is connected to the ceiling 124 via the stem 156. For example, the showerhead 114 is supported by the ceiling 124 to which the stem 156 is attached, e.g., bolted, screwed to, etc. The RF transmission line 154 couples the output O1 of the IMC 106 and extends via the point P1 and the ceiling 124 into the stem 156 located within a housing of the plasma chamber 152. The housing of the plasma chamber 152 is made of the ceiling 124, the side wall 122, and the bottom portion 126. The housing of the plasma chamber 152 is coupled to the ground potential. The RF transmission line 154 extends into the stem 156 to be connected to the top electrode 120. An inductance of the RF transmission line 154 is represented as L1*c*.

The modified RF signal that is supplied at the output O1 of the IMC 106 is transferred via the RF transmission line 154 to the top electrode 120. A layout of the showerhead 114 and the ceiling 124, e.g., the distance d2 between the top surface 135 of the showerhead 114 and the ceiling 124, creates a parasitic capacitance C11*c* between the top surface 135 of the showerhead 114 and the ceiling 124. Moreover, a layout of the showerhead 114 of the plasma chamber 152 and the side wall 122, e.g., a distance between a side surface of the showerhead 114 and the side wall 122 of the plasma chamber 152, creates another parasitic capacitance C12*c* between the showerhead 114 and the side wall 122 of the plasma chamber 152. In some embodiments, a sum of the parasitic capacitances C11*c* and C12*c* associated with the plasma chamber 152 is less than a sum of the parasitic capacitances C11*f* and C12*f* associated with the plasma chamber 102. For example, a major difference between the sums is created by a difference between the capacitances C12*f* and C12*c*. The shunt circuit 108 that is connected to the RF transmission line 154 at the point P1 increases impedances of low impedance paths created by the parasitic capacitances C11*c* and C12*c* so that there is a decrease in the RF current of the modified RF signal through the parasitic capacitances C11*s* and C12*c* to increase efficiency of processing the wafer 112. By controlling a capacitance of the capacitor Cs, or an inductance of the inductor Ls, or both, the impedances of the low impedance paths are increased to increase the RF voltage of the modified RF signal. Impedances associated with the parasitic capacitances C11*c* and C12*c* are negated by increasing the impedances of the low impedance paths. For example, the impedances associated with the parasitic capacitances C11*c* and C12*c* are low. With the use of the shunt circuit 108, the low impedances are negated by increasing the low impedances.

FIG. 1C is a diagram of an embodiment of a plasma processing system 170 in which a shunt circuit is situated within the housing of a plasma chamber 172. The plasma processing system 170 is the same as the plasma processing system 100 of FIG. 1A except that in the plasma processing system 170, the shunt circuit is coupled to a portion of the RF transmission line 132 that is located inside the housing of the plasma chamber 172. Moreover, the plasma chamber 172 is the same as the plasma chamber 102 (FIG. 1A) except that the plasma chamber 172 includes the inductor Ls of the shunt circuit.

The inductor Ls is connected at a point on the RF transmission line 132 between the point P1 on the RF transmission line 132 outside the housing and a point P2 at which the RF transmission line 132 is coupled to the top electrode 120. For example, the inductor Ls is situated between the showerhead 114 and the ceiling 124. The inductor Ls is coupled to the ground potential at its end E2 and is connected to the point between the points P1 and P2 at its end E1. In some embodiments, the inductor Ls is coupled to the ground potential by being connecting to the ceiling 124 or the side wall 122, both of which are at the ground potential. The inductance of the inductor Ls increases the low impedance between the top surface 135 of the showerhead 114 and the ceiling 124 and the low impedance between the side surface of the showerhead 114 and the side wall 122 so that the modified RF signal that is output from the IMC 106 is transferred via the RF transmission line 132 to the top electrode 120 and further to the gap between the showerhead 114 and the pedestal 116.

In various embodiments in which the top electrode 120 is coupled to the ground potential instead of the top electrode 120, and the bottom electrode 118 is coupled to the IMC 106 via the RF transmission line 132, a point, similar to the point P2, is located at the bottom electrode 118 instead of at the top electrode 120. Moreover, the point P1 is located below the bottom surface 133 of the bottom portion 126. The inductor Ls is coupled between the point P1 and the point located at the bottom electrode 118, and is located between the bottom portion 126 and the pedestal 116.

In some embodiments, the shunt circuit 108 (FIG. 1A) is implemented inside the plasma chamber 172 in place of the inductor Ls. For example, the shunt circuit 108 is connected between the ends E1 and E2 and is placed between the ceiling 124 of the plasma chamber 172 and the showerhead 114 of the plasma chamber 172.

FIG. 1D is a diagram of an embodiment of a plasma processing system 180 in which a plasma chamber 182 includes a shunt circuit within a housing of a plasma chamber 182. The plasma processing system 180 is the same as the plasma processing system 150 of FIG. 1B except that in the plasma processing system 180, the shunt circuit is located within the housing of the plasma chamber 182. The plasma chamber 182 is the same as the plasma chamber 152 (FIG. 1B) except that the plasma chamber 182 includes the inductor Ls of the shunt circuit. The inductor Ls is coupled to a point between the point P1 and a point P3 at which the RF transmission line 154 is coupled to the top electrode 120. For example, the inductor Ls is situated between the showerhead 114 and the ceiling 124. The housing of the plasma chamber 182 is formed by the ceiling 124, the side wall 122, and the bottom portion 126. The inductor Ls located inside the housing and is coupled to a portion, of the RF transmission line 154, situated inside the housing of the plasma chamber 182. The inductance of the inductor Ls increases the low impedance between the top surface 135 of the showerhead 114 and the ceiling 124 and the low impedance between the side surface of the showerhead 114 and the side wall 122 so that the modified RF signal that is output from the IMC 106 is transferred via the RF transmission line 154 to the top electrode 120 and further to the gap between the showerhead 114 and the pedestal 116.

In various embodiments, the top electrode 120 of the plasma chamber 182 is coupled to the ground potential instead of the bottom electrode 118, and the bottom electrode 118 is coupled to the IMC 106 via the RF transmission line 132. The point P1 is located at the pre-determined distance below the bottom surface 133 of the bottom portion 126. The inductor Ls is coupled to a point located between the point P1 and a point at which the RF transmission line 132 is coupled to the bottom electrode 118. The inductor Ls is located between the bottom portion 126 and the pedestal 116. These embodiments are illustrated below in FIG. 1H.

In some embodiments, the shunt circuit 108 (FIG. 1A) is implemented inside the plasma chamber 182 in place of the inductor Ls. For example, the shunt circuit 108 is connected between the ends E1 and E2 and is placed between the ceiling 124 of the plasma chamber 182 and the showerhead 114 of the plasma chamber 182.

FIG. 1E is a diagram of an embodiment of a plasma processing system 190 to illustrate a coupling of the shunt circuit 108 to the point P1 on the RF transmission line 132 that is coupled to the bottom electrode 118 instead of the top electrode 120. The plasma processing system 190 is the same as the plasma processing system 100 (FIG. 1A) except that the plasma processing system 190 includes a plasma chamber 192 instead of the plasma chamber 102 (FIG. 1A). The plasma chamber 192 is a flush-mount type plasma chamber. In the plasma chamber 192, the top electrode 120 is coupled to the ground potential and the bottom electrode 118 is coupled to the RF transmission line 132. Moreover, the pedestal 116 is mounted to the side wall 122 via the side mount 138. The side mount 138 couples the pedestal 116 to the side wall 122. The parasitic capacitance C12*c* is created between the pedestal 116 and the side wall 122 instead of between the showerhead 114 and the side wall 122. Also, the showerhead 114 is mounted from the ceiling 124 via the stem 156.

Moreover, the shunt circuit 108 is coupled to the point P1 on the RF transmission line 132 to increase impedance associated with, e.g., generated by, a parasitic capacitance between the pedestal 116 and the side wall 122 and to increase impedance generated by a parasitic capacitance between the pedestal 116 and the top surface 131 of the bottom portion 126. The point P1 is located at the pre-determined distance from the bottom portion 126 instead of being located at the pre-determined distance from the ceiling 124. The end E2 of the shunt circuit 108 is coupled to the ground potential by being coupled to the bottom surface 133 of the bottom portion 126 of the housing of the plasma chamber 192. The shunt circuit 108 faces the bottom surface 133 of the bottom portion 126.

FIG. 1F is a diagram of an embodiment of a plasma processing system 194 to illustrate a coupling of the shunt circuit 108 to the point P1 on the RF transmission line 132 that is coupled to the bottom electrode 118 instead of the top electrode 120. The plasma processing system 194 is the same as the plasma processing system 150 (FIG. 1B) except that the plasma processing system 194 includes a plasma chamber 196 instead of the plasma chamber 152 (FIG. 1B). In the plasma chamber 196, which is a chandelier-type plasma chamber, the top electrode 120 is coupled to the ground potential and the bottom electrode 118 is coupled to the RF transmission line 132. The end E2 of the shunt circuit 108 is coupled to the ground potential by being coupled to the bottom surface 133 of the bottom portion 126 of the housing of the plasma chamber 196.

FIG. 1G is a diagram of an embodiment of a plasma processing system 195 to illustrate use of the inductor Ls to increase impedance associated with parasitic capacitance of a plasma chamber 197. The plasma processing system 195 is the same as the plasma processing system 190 (FIG. 1E) except that in the plasma processing system 195, the inductor Ls is coupled between the point P1 on the RF transmission line 132 coupled to the bottom electrode 118 and a point P4 at the bottom electrode 118.

In the plasma chamber 197, the RF transmission line 132 is coupled to the point P4 at the bottom electrode 118 and the end E1 of the inductor Ls is coupled to the RF transmission line 132 between the points P1 and P4. The end E2 of the inductor Ls is coupled to the ground potential. For example, the end E2 is coupled to the top surface 131 of the bottom portion 126. In some embodiments, the end E2 of the inductor Ls is coupled to the side wall 122. The inductor Ls increases the impedance associated with the parasitic capacitance between the pedestal 116 and the side wall 122 and the parasitic capacitance between the pedestal 116 and the bottom portion 126.

In some embodiments, the shunt circuit 108 (FIG. 1A) is implemented inside the plasma chamber 197 in place of the inductor Ls. For example, the shunt circuit 108 is connected between the ends E1 and E2 between the bottom portion 126 of the plasma chamber 197 and the pedestal 116 of the plasma chamber 197.

Figure 1H:
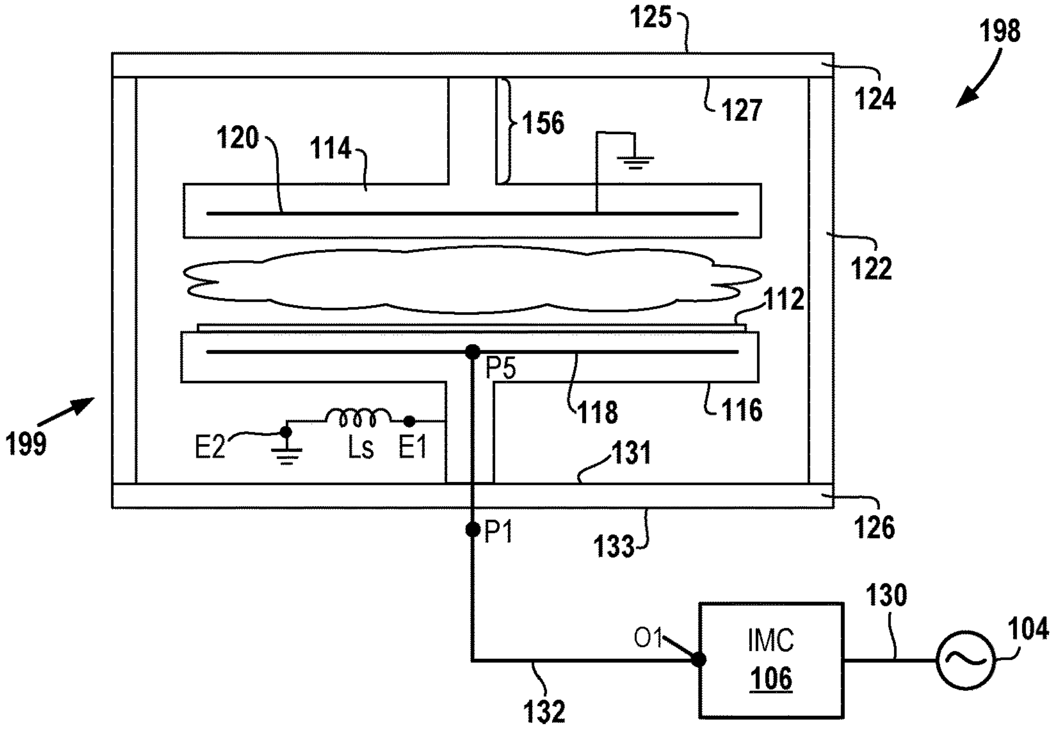
FIG. 1H is a diagram of an embodiment of a plasma processing system to illustrate use of a shunt circuit within a housing of the chandelier-type plasma chamber to negate an impedance associated with parasitic capacitance of the chandelier-type type plasma chamber.

FIG. 1H is a diagram of an embodiment of a plasma processing system 198 to illustrate use of the inductor Ls to increase impedance associated with parasitic capacitance of a plasma chamber 199. The plasma processing system 198 is the same as the plasma processing system 180 (FIG. 1D) except that the plasma processing system 198 has the plasma chamber 199 and the inductor Ls is coupled between the point P1 on the RF transmission line 132 coupled to the bottom electrode 118 and a point P5 at the bottom electrode 118. In the plasma chamber 199, the RF transmission line 132 is coupled to the point P5 at the bottom electrode 118 and the end E1 of the inductor Ls is coupled to the RF transmission line 132 between the points P1 and P5.

In some embodiments, the shunt circuit 108 (FIG. 1A) is implemented inside the plasma chamber 199 in place of the inductor Ls. For example, the shunt circuit 108 is connected between the ends E1 and E2 between the bottom portion 126 of the plasma chamber 199 and the pedestal 116 of the plasma chamber 199.

Figure 2:
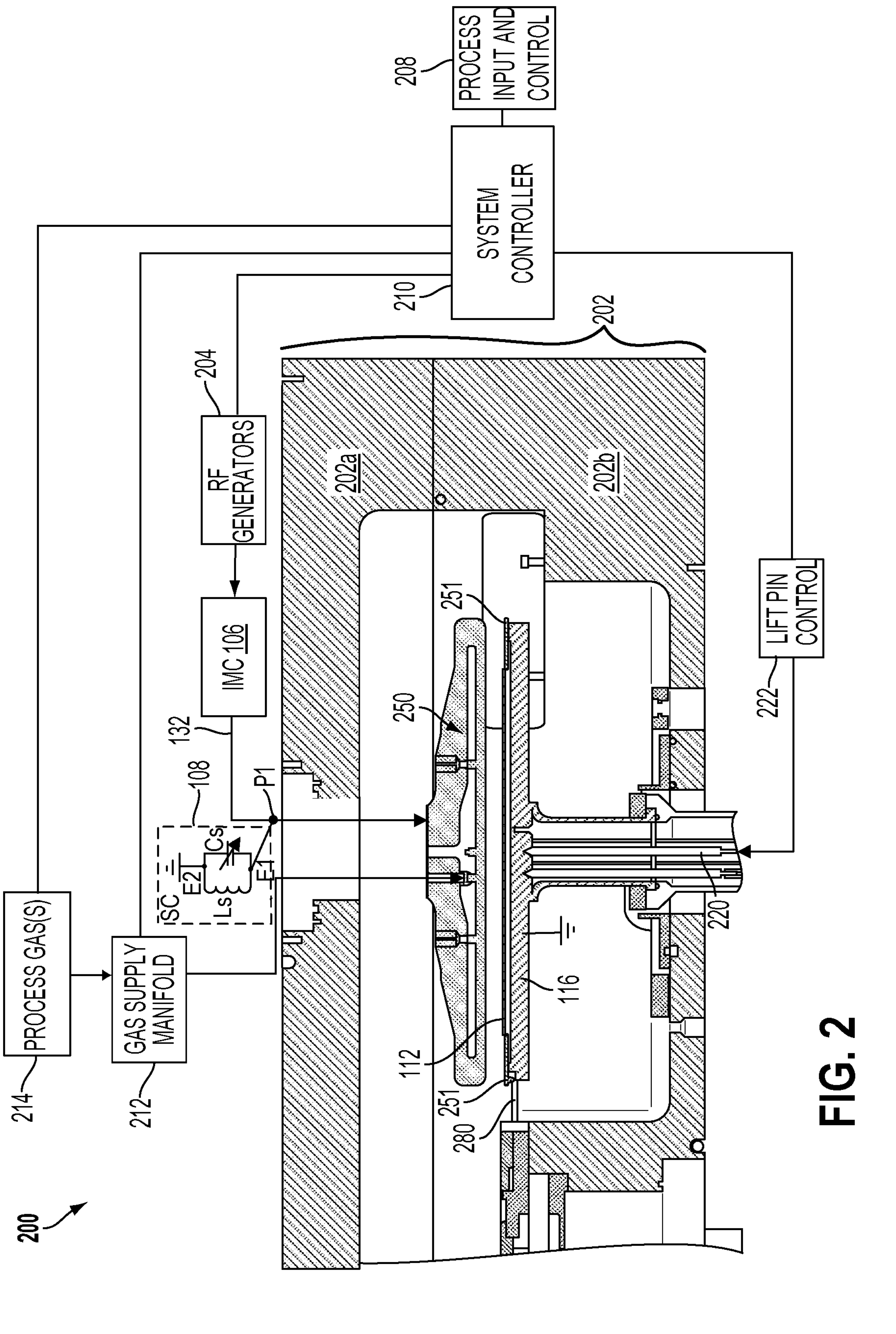
FIG. 2 is a diagram of an embodiment of a plasma processing system.

FIG. 2 is a diagram of an embodiment of a plasma processing system 200, which is an example of the PECVD system used to process the wafer 112. The plasma processing system 200 includes a plasma chamber 202 having a lower chamber portion 202*b* and an upper chamber portion 202*a*. The plasma chamber 202 is an example of the plasma chamber 102 (FIG. 1A).

A center column is configured to support the pedestal 116. The center column is also shown to include lift pins 220, which are controlled by a lift pin control 222. The lift pins 220 are used to raise the wafer 112 from the pedestal 116 to allow an end-effector to pick the wafer 112 and to lower the wafer 112 after being placed by the end end-effector.

The plasma chamber 202 further includes a showerhead 250 located above the pedestal 116 for processing the wafer 112. The showerhead 250 is an example of the showerhead 114 (FIG. 1A). The showerhead 250 is electrically coupled to the IMC 106. The IMC 106 is coupled to multiple radio frequency (RF) generators 204. The RF generators 204 are controlled by a system controller 210. Examples of a controller include a processor and a memory device. A processor, as described herein, is an application specific integrated circuit (ASIC), a programmable logic device (PLD), a central processing unit (CPU), or a microprocessor, etc. Examples of a memory device, as described herein, include a read-only memory (ROM), a random access memory (RAM), a redundant array of storage disks, a hard disk, a Flash memory, etc. The system controller 210 operates the plasma processing system 200 by executing a process input and control 208. The process input and control 208 includes process recipes, such as power levels, timing parameters, process gasses, mechanical movement of the wafer 112, etc., so as to deposit or form films over the wafer 112.

The plasma processing system 200 further includes a gas supply manifold 212 that is connected to process gases 214, e.g., gas chemistry supplies from a facility, etc. Depending on the processing being performed, the system controller 210 controls a delivery of the process gases 214 via the gas supply manifold 212. The chosen process gases are then flown into the showerhead 250 and distributed in a space volume, e.g., the gap, etc., defined between the showerhead 250 face that faces that wafer 112 and the pedestal 116.

Further, in some embodiments, the process gases 214 are premixed or not. Appropriate valving and mass flow control mechanisms are employed to ensure that the correct process gases are delivered during deposition and plasma treatment phases of the process. The process gases 214 exit the plasma chamber 202 via an outlet. A vacuum pump, e.g., a one or two stage mechanical dry pump, a turbomolecular pump, etc., draws process gases out and maintains a suitably low pressure within the plasma chamber 202 by a close loop controlled flow restriction device, such as a throttle valve or a pendulum valve.

Also shown is a carrier ring 251 that encircles an outer region of the pedestal 116. The carrier ring 251 sits over a carrier ring support region that is a step down from a wafer support region in the center of the pedestal 116. The carrier ring 251 includes an outer edge side of its disk structure, e.g., outer radius, etc., and a wafer edge side of its disk structure, e.g., inner radius, etc., that is closest to where the wafer 112 sits. The wafer edge side of the carrier ring 251 includes a plurality of contact support structures which lift the wafer 112 when the carrier ring 251 is lifted by multiple spider forks 280. The carrier ring 251 is therefore lifted along with the wafer 112 and is rotated to another station, e.g., in a multi-station system.

The shunt circuit 108 is coupled to the point P1 located within the predetermined distance above the portion 202*a* of the plasma chamber 202. In some embodiments, the point P1 is closer to the portion 202*a* compared to the IMC 106. The shunt circuit 108 is coupled to the ground potential at the end E2 and the end E1 of the shunt circuit 108 is coupled to the point P1 on the RF transmission line 132. The shunt circuit 108 increases impedance between the showerhead 250 and the portion 202*a* of the plasma chamber 202. The increase in the impedance increases voltage at the output O1 of the IMC 106. The increase in the voltage increases power of the modified RF signal transferred via the RF transmission line 132 towards the gap between the showerhead 250 and the pedestal 116.

Figure 3:
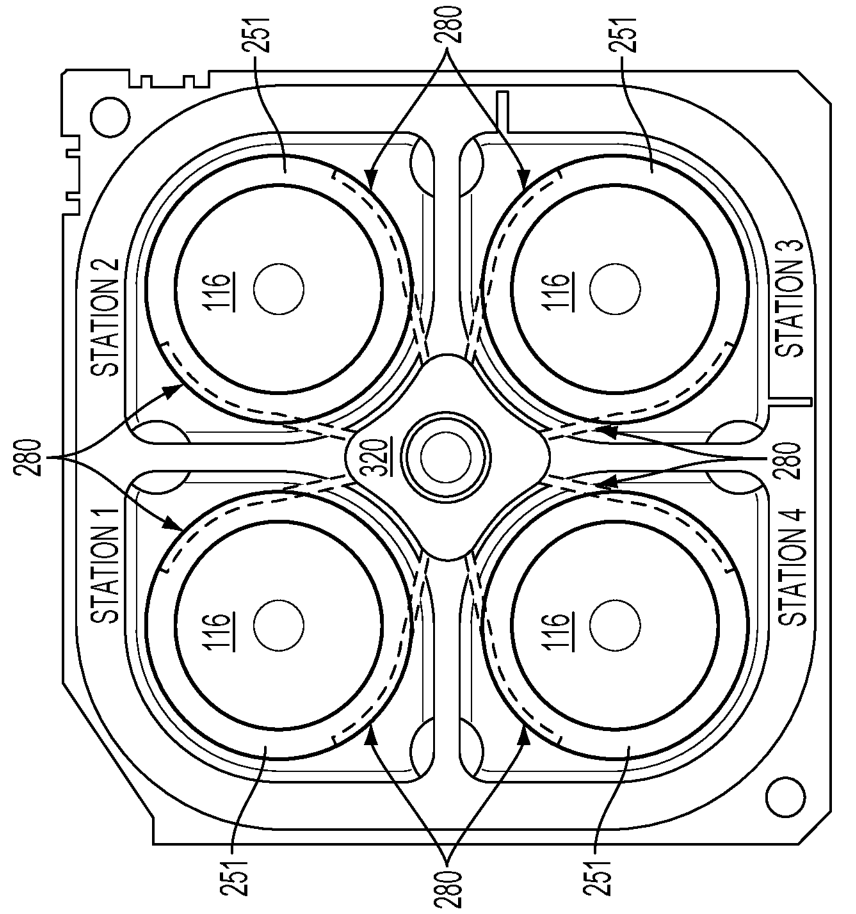
FIG. 3 illustrates a top view of an embodiment of a multi-station processing tool in which four processing stations are provided.

FIG. 3 illustrates a top view of a multi-station processing tool, where four processing stations, which are station 1, station 2, station 3, and station 4, are provided. The plasma chamber 202 (FIG. 2) is an example of each of the four processing stations 1 through 4. Wafers 112 being processed on the four stations are accessed by the spider forks 280. In one embodiment, there is no isolation wall or other mechanism to isolate one station from another. Each spider fork 280 includes a first and second arm, each of which is positioned around a portion of each side of the pedestal 116. In this view, the spider forks 280 are drawn in dash-lines, to convey that they are below the carrier ring 251. The spider forks 280, using an engagement and rotation mechanism 320, raise up and lift the carrier rings 251 from a lower surface of the carrier rings 251 from the stations 1 through 4 simultaneously, and then rotate between two or more stations 1 through 4 before lowering the carrier rings 251. During the rotation, at least one of the carrier rings 251 supports the wafer 112 to a next location so that further plasma processing, treatment and/or film deposition takes place on the wafer 112.

Figure 4:
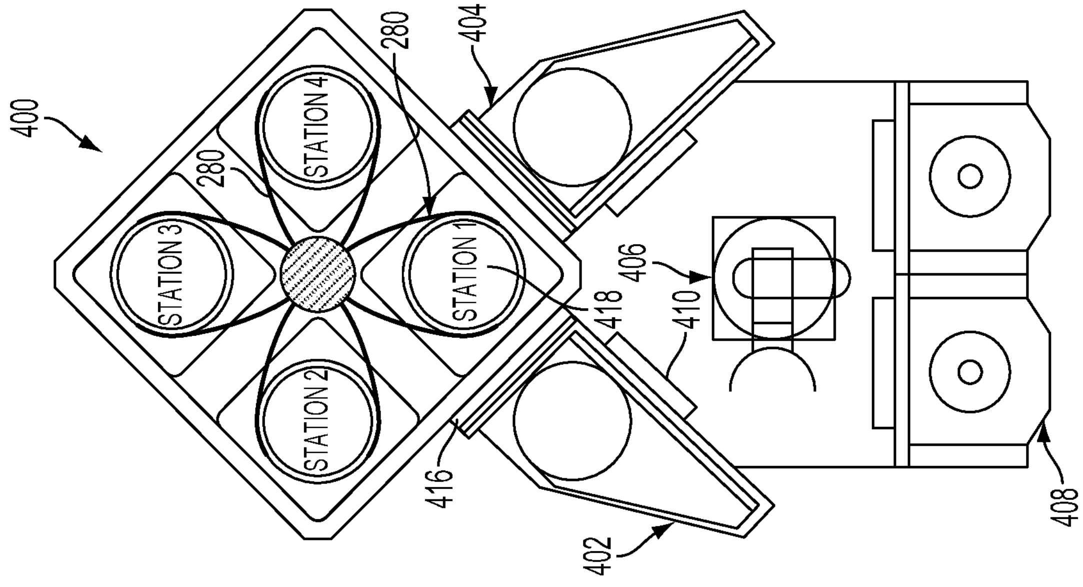
FIG. 4 shows a schematic view of an embodiment of a multi-station processing tool with an inbound load lock and an outbound load lock.

FIG. 4 shows a schematic view of an embodiment of a multi-station processing tool 400 with an inbound load lock 402 and an outbound load lock 404. A robot 406, at atmospheric pressure, moves substrates, e.g., the wafer 112, etc., from a cassette loaded through a pod 408 into the inbound load lock 402 via an atmospheric port 410. The inbound load lock 402 is coupled to a vacuum source (not shown) so that, when atmospheric port 410 is closed, the inbound load lock 402 is pumped down. The inbound load lock 402 also includes a chamber transport port 416 interfaced with one of the stations 1 through 4. Thus, when the chamber transport 416 is open, another robot (not shown) moves the wafer 112 from the inbound load lock 402 to the pedestal 116 of the station 1 for processing. The multi-station processing toll 400 includes the multi-station processing tool illustrated using FIG. 3.

In some embodiments, a low pressure environment is maintained in an enclosure that encloses the stations 1 through 4 so that substrates are transferred using the carrier ring 251 among the stations 1 through 4 without experiencing a vacuum break and/or air exposure. Each of the stations 1 through 4 includes a process station substrate holder and process gas delivery line inlets.

The spider forks 280 transfer substrates among the stations 1 through 4. The spider forks 280 rotate and enable transfer of the wafer 112 from one of the stations 1 through 4 to another one of the stations 1 through 4. The transfer occurs by enabling the spider forks 280 to lift the carrier rings 251 from an outer undersurface, which lifts the wafer 112, and rotates the wafer 112 and the carrier ring 251 together to the next station. In one configuration, the spider forks 280 are made from a ceramic material to withstand high levels of heat during processing.

In various embodiments, a number of stations other than four is used. For example, three or two or five plasma processing stations are used to process the wafer 112.

Figure 5A:
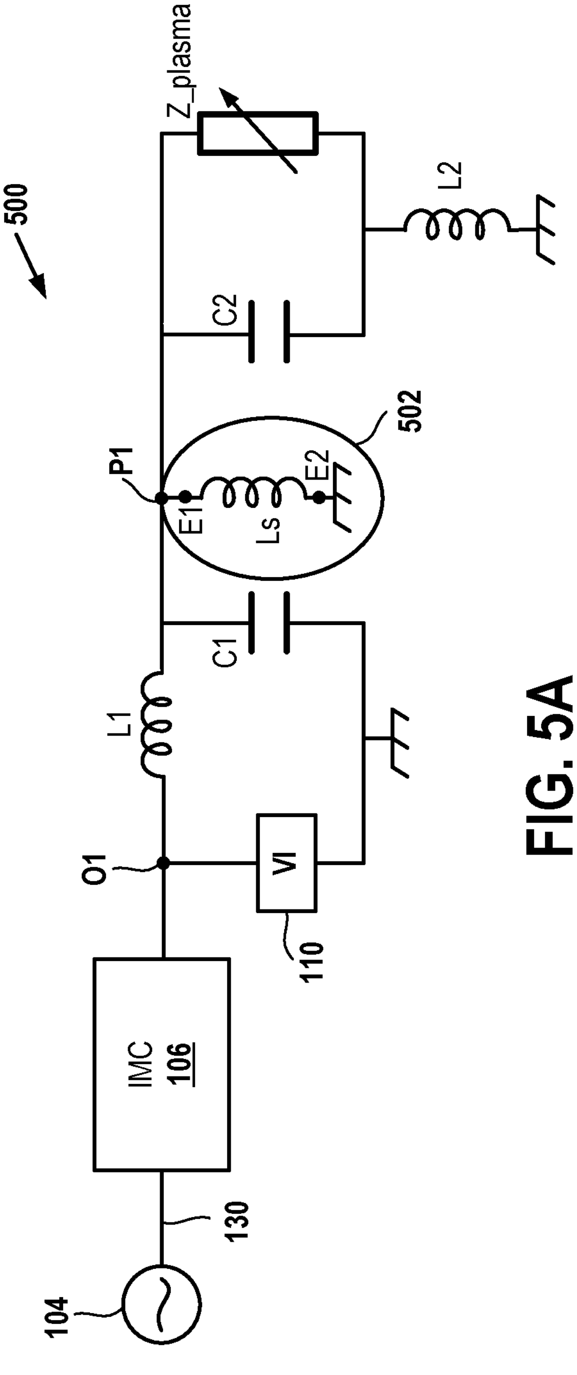
FIG. 5A is a diagram of an embodiment of a system to illustrate use of a fixed inductor as a shunt circuit to negate impedances associated with parasitic capacitances.

FIG. 5A is a diagram of an embodiment of a system 500 to illustrate use of a shunt circuit 502 to negate impedances associated with parasitic capacitances. The system 500 includes the RF generator 104, the IMC 106, the VI probe 110, an inductor L1, a parasitic capacitance C1, the shunt circuit 502, the capacitor C2, the inductor L2, and impedance Z_plasma of plasma formed within the gap between the showerhead 114 and the pedestal 116. The parasitic capacitance C1 represents a sum of the parasitic capacitances C11*f* and C12*f* a the flush-mount type plasma chamber. In some embodiments, the parasitic capacitance C1 represents a sum of the parasitic capacitances C11*c* and C12*c* for a chandelier-type plasma chamber. Also, the inductor L1 has the inductor L1*f* of the RF transmission line 132 (FIG. 1A). In some embodiments, the inductor L1 has the inductor L1*c* of the RF transmission line 154 (FIG. 1B).

The IMC 106 is coupled to the inductor L1, which is coupled to via the parasitic capacitance C1 to the ground potential. Moreover, the VI probe 110 is coupled to the output O1 of the IMC 106. The end E1 of the inductor Ls of the shunt circuit 502 is coupled to the point P1 on an RF transmission line, e.g., the RF transmission line 132, the RF transmission line 154, etc. The point P1 is coupled to a top plate of the capacitor C2. The top plate represents the showerhead 114 (FIG. 1A). A bottom plate of the capacitor C2 is coupled to the inductor L2. The bottom plate represents the pedestal 116 (FIG. 1A). The impedance Z_plasma is within the gap between the showerhead 114 and the pedestal 116. The impedance Z_plasma is parallel to the capacitor C2 and both the capacitor C2 and the impedance Z_plasma are coupled to the inductor L2, which is coupled to the ground potential.

The shunt circuit 502 is coupled in parallel to the parasitic capacitance C1. By controlling the inductance of the inductor Ls, impedance of the parasitic capacitance C1 is controlled to increase the impedance so that there is an increase in an amount of RF voltage at the output O1 and an increase in an amount of RF voltage of the modified RF signal that is supplied via the RF transmission line, e.g., the RF transmission line 132 (FIG. 1A), the RF transmission line 154 (FIG. 1B), etc., to the top plate of the capacitor C2. The increase in the amount of the RF voltage of the modified RF signal increases efficiency of a plasma process, e.g., deposition, cleaning, etc., being performed by a plasma chamber.

Figure 5B:
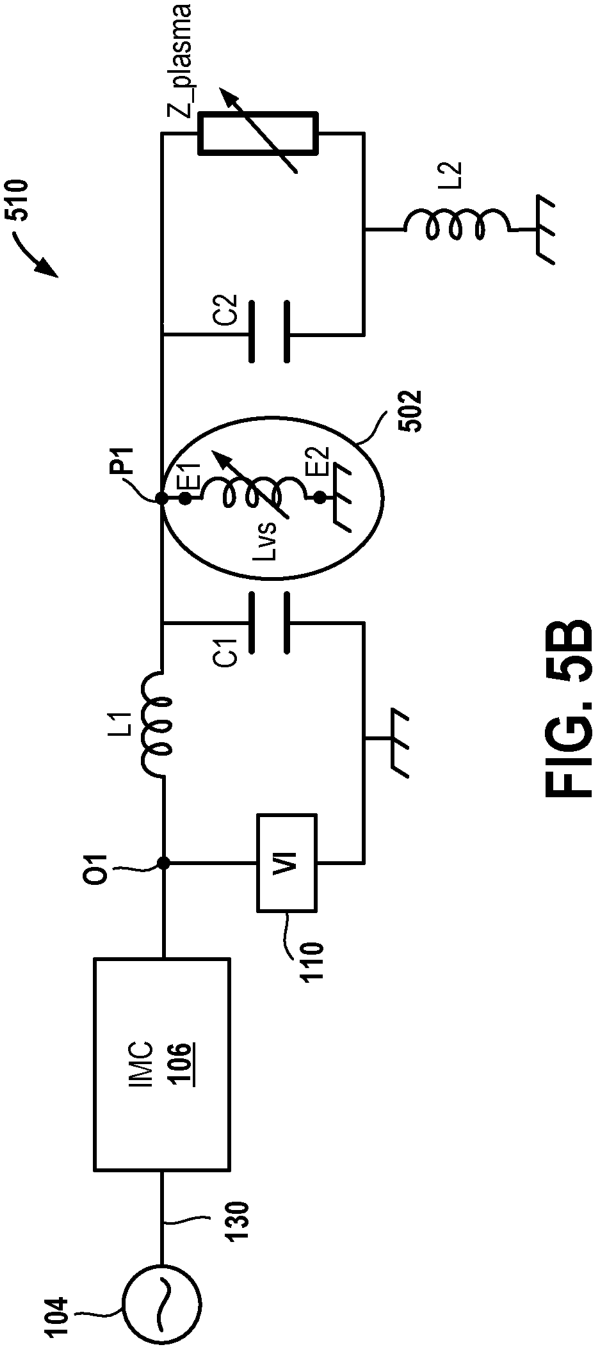
FIG. 5B is a diagram of an embodiment of a system to illustrate a shunt circuit having a variable inductor.

FIG. 5B is a diagram of an embodiment of a system 510 to illustrate a shunt circuit 512 having a variable inductor Lvs. An inductance value of the inductor Lvs is the same as that of the inductor Ls. The system 510 is the same as the system 500 (FIG. 5A) except that in the system 510, the inductor Ls is replaced by the variable inductor Lvs. The variable inductor Lvs is coupled between the ends E1 and E2, and is parallel to the parasitic capacitance C1. An inductance of the variable inductor Lvs is modified to increase impedance generated as a result of the parasitic capacitance C1. The increase in the impedance increases an amount of RF voltage of the modified RF signal flowing towards the top plate of the capacitor C2 to increase plasma processing efficiency.

Figure 5C:
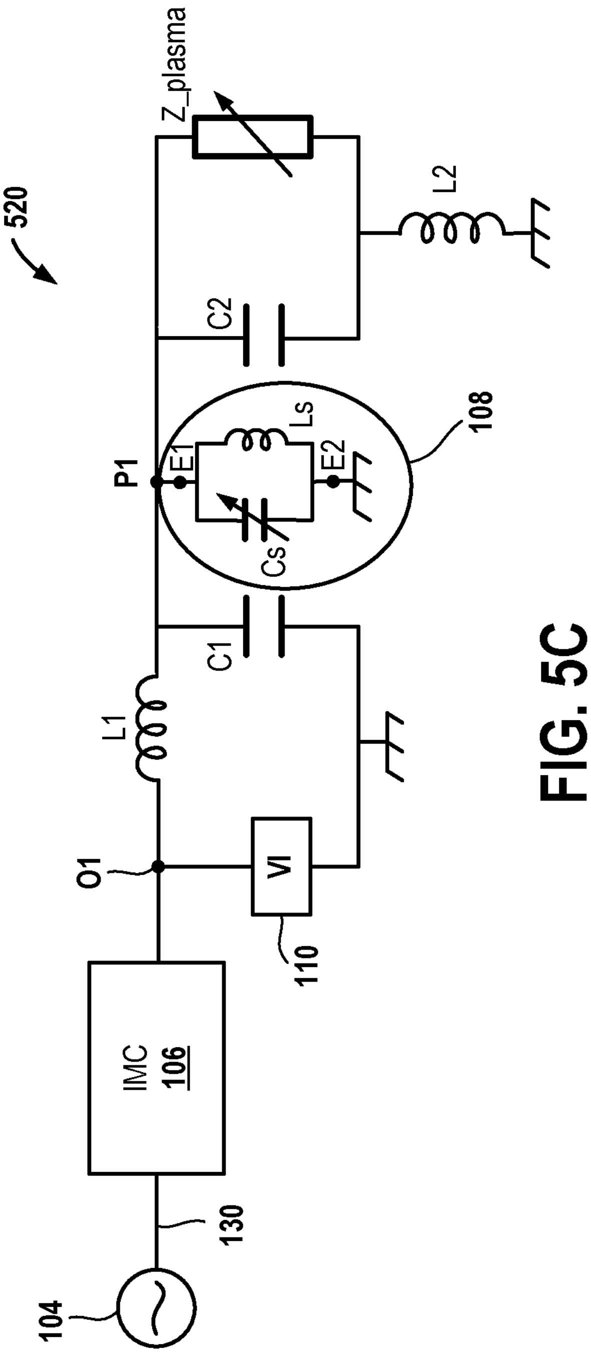
FIG. 5C is a diagram of an embodiment of a system to illustrate a shunt circuit having a variable capacitor and a fixed inductor.

FIG. 5C is a diagram of an embodiment of a system 520 to illustrate the shunt circuit 108 coupled between the ends E1 and E2. The system 520 is the same as the system 500 (FIG. 5A) except that in the system 520, the inductor Ls is coupled in parallel with the capacitor Cs. The end E1 of the shunt circuit 108 is coupled to the point P1 between the inductor L1 and the capacitor C2. The other end E2 of the shunt circuit 108 is coupled to the ground potential.

Both the inductor Ls and the capacitor Cs are coupled in parallel with the parasitic capacitance C1. The parallel coupling increases an impedance of the parasitic capacitance C1 to increase RF voltage at the output O1. Also, a capacitance of the capacitor Cs is changed to increase the RF voltage at the output O1. The increase in the RF voltage at the output O1 increases efficiency in processing the wafer 112.

Figure 5D:
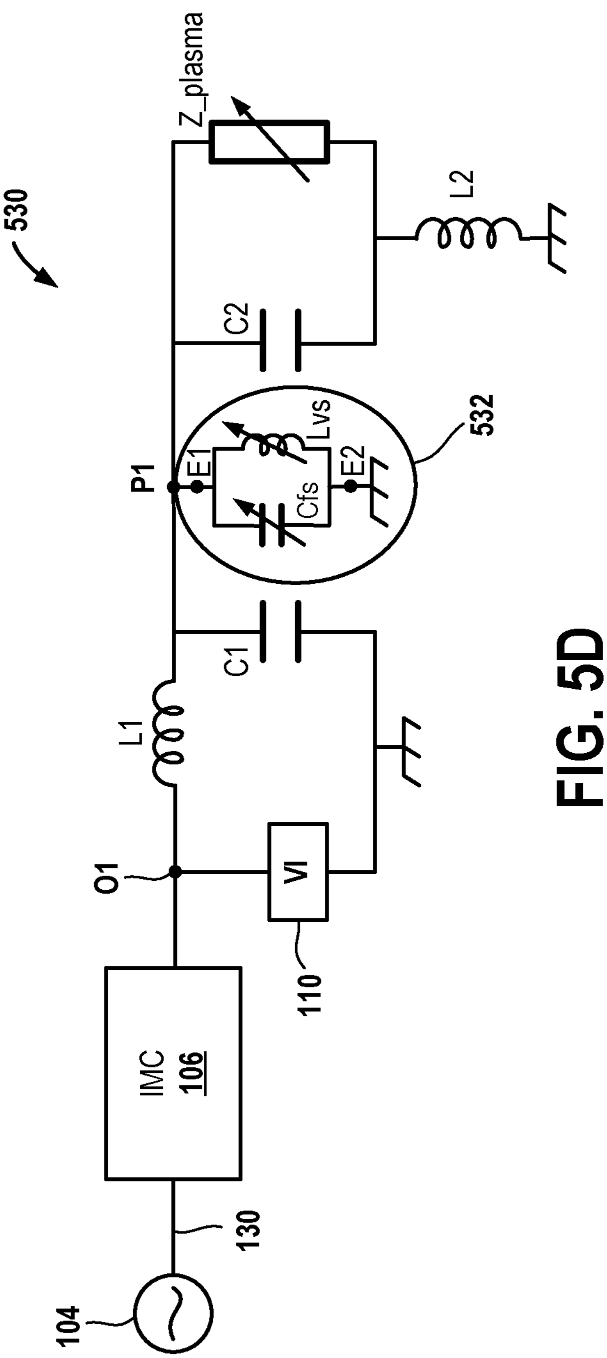
FIG. 5D is a diagram of an embodiment of a system to illustrate a shunt circuit having a variable inductor and a fixed capacitor.

FIG. 5D is a diagram of an embodiment of a system 530 in which a shunt circuit 532 having a fixed capacitor Cfs and the variable inductor Lvs is used. The fixed capacitor Cfs has the same capacitance values as the capacitor Cs. The system 530 is the same as the system 520 (FIG. 5B) except that in the system 530, the variable inductor Lvs is coupled in parallel with the fixed capacitor Cfs. The shunt circuit 532 includes the fixed capacitor Cfs in parallel with the variable inductor Lvs. The shunt circuit 532 is coupled between the ends E1 and E2.

Also, both the fixed capacitor Cfs and the variable inductor Lvs are coupled in parallel to the parasitic capacitance C1. The parallel coupling increases an impedance of the parasitic capacitance C1 to increase RF voltage at the output O1. Also, an inductance of the variable inductor Lvs is changed to increase the RF voltage at the output O1.

Figure 5E:
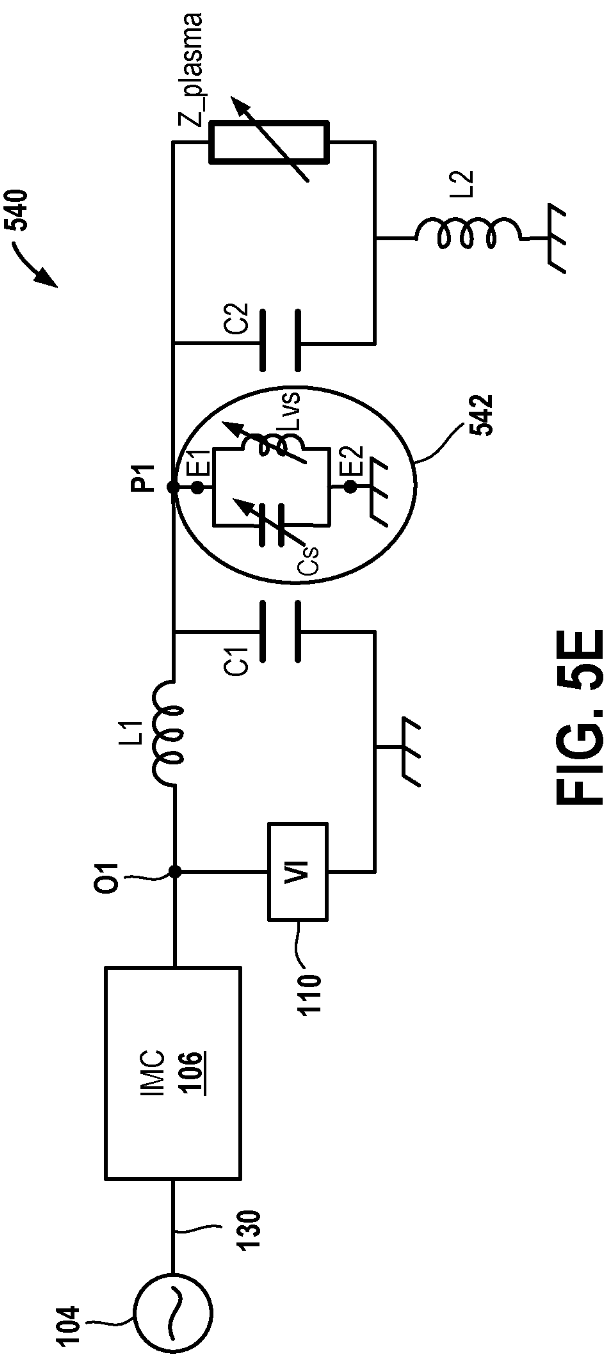
FIG. 5E is a diagram of an embodiment of a system to illustrate a shunt circuit having a variable capacitor and a variable inductor.

FIG. 5E is a diagram of an embodiment of a system 540 to illustrate use of the capacitor Cs and the variable inductor Lvs in a shunt circuit 542. The system 540 is the same as the system 530 (FIG. 5C) except that in the system 540, the variable inductor Lvs is coupled in parallel with the capacitor Cs. The shunt circuit 542 is coupled between the ends E1 and E2. The capacitor Cs and the variable inductor Lvs are coupled in parallel to the parasitic capacitor C1.

Inductance of the variable inductor Lvs and the capacitance of the capacitor Cs are varied to increase the impedance generated as a result of the parasitic capacitor C1. The increase in the impedance increases RF voltage at the point O1 to increase the RF voltage of the modified output signal that is output from the IMC 106.

In some embodiments, an inductance of the inductor Ls is fixed when during processing of the wafer 112, the inductance is not modified either manually or by using a motor. In various embodiments, a capacitance of the capacitor Cfs is fixed when during processing of the wafer 112, the capacitance is not modified either manually or by using a motor.

Figure 6C:
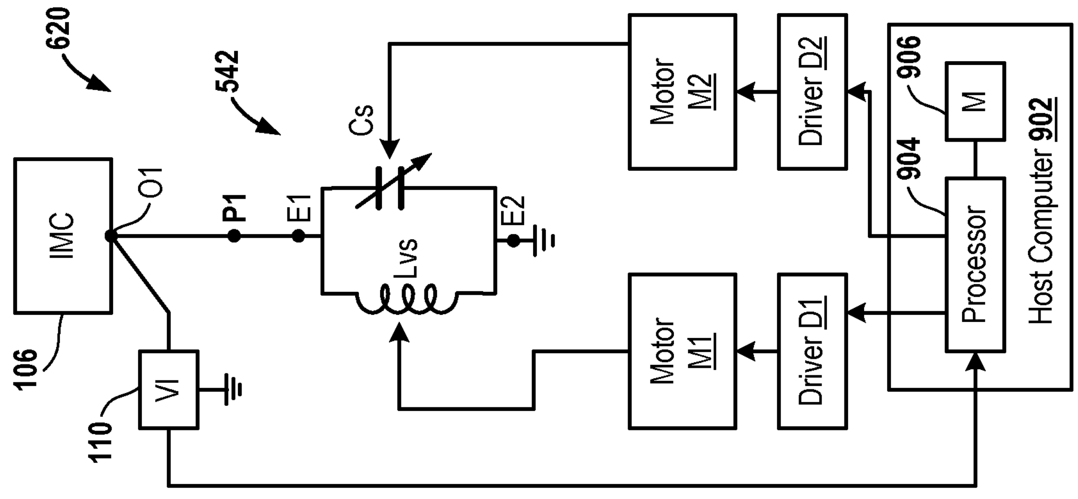
FIG. 6C is a diagram of an embodiment of a system to illustrate a change in capacitance of a capacitor of a shunt circuit and an inductance of an inductor of the shunt circuit until the parameter is within a pre-determined extent.
Figure 6B:
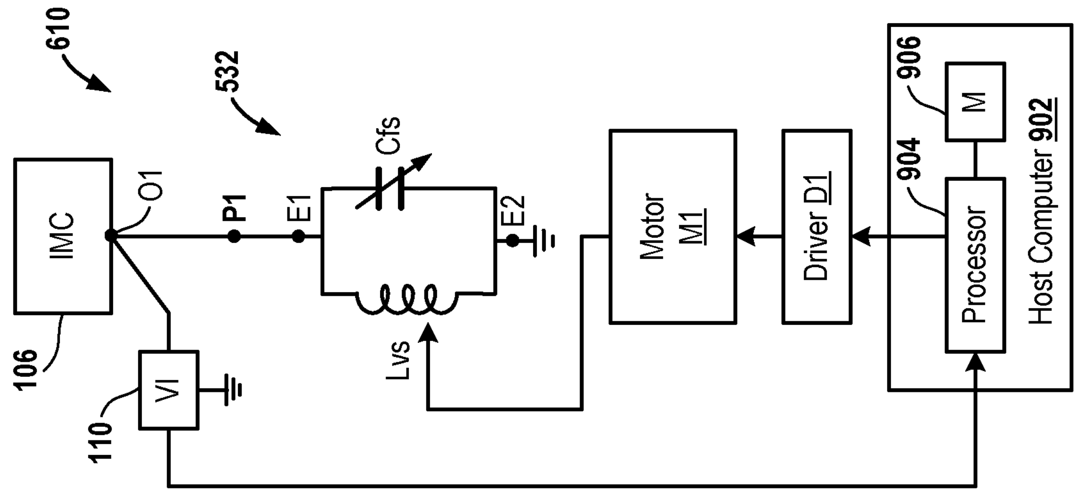
FIG. 6B is a diagram of an embodiment of a system to illustrate a change in an inductance of an inductor of a shunt circuit until the parameter is within a pre-determined span.
Figure 6A:
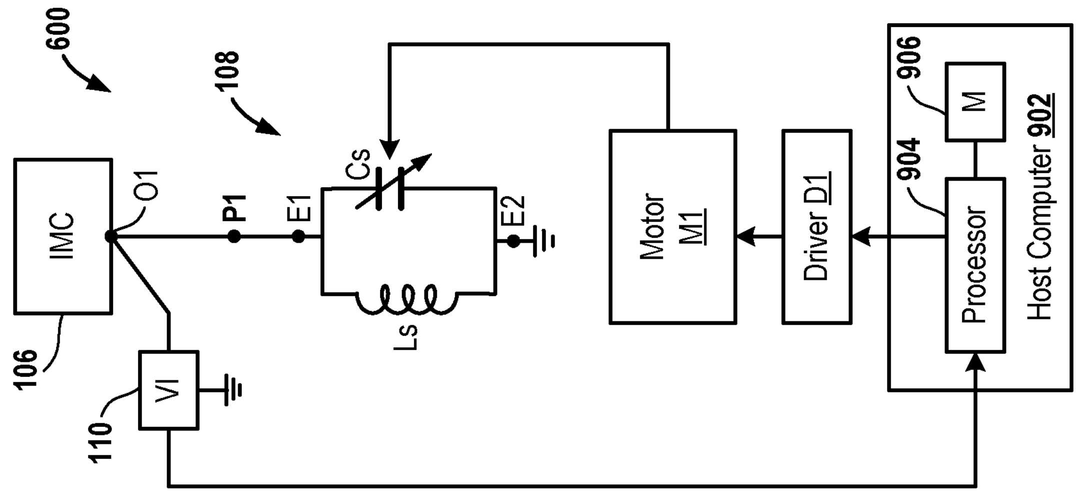
FIG. 6A is a diagram of an embodiment of a system to illustrate a change in capacitance of a capacitor of a shunt circuit until a parameter is within a pre-determined range.

FIG. 6A is a diagram of an embodiment of a system 600 to illustrate a change in capacitance of the capacitor Cs of the shunt circuit 108 until a parameter at the output O1 of the IMC 106 is within a pre-determined range. Examples of the parameter are provided below. The system 600 includes the IMC 106, the VI probe 110, the shunt circuit 108, a motor M1, a driver D1, and a host computer 902. The host computer 902 includes a processor 904 and a memory device 906. Examples of the host computer 902, the processor 904, and the memory device 906 are provided below. Also, examples of the driver D1 and the motor M1 are provided below.

The processor 904 is coupled to the driver D1, which is coupled to the motor M1. The motor M1 is coupled via a connection mechanism to the capacitor Cs. Examples of the connection mechanism are provided below. Also, the VI probe 110 that is coupled to the output O1 of the IMC 106 is coupled to the processor 904 via a transfer cable, examples of which are provided below.

The processor 904 receives a measurement of the parameter from the VI probe 110 coupled to the output O1 and determines whether the parameter is within the pre-determined range. Upon determining that the parameter is not within the pre-determined range, the processor 904 sends a command signal to the driver D1. Upon receiving the command signal, the driver D1 generates a current signal to send to the motor M1. The motor M1 operates to change a capacitance of the capacitor Cs. For example, when a stator of the motor M1 receives the current signal, a rotor of the motor M1 rotates to change an area between two parallel plates of the capacitor Cs or to change a distance between the two plates. The change in the capacitance of the capacitor Cs changes the parameter measured by the VI probe 110 that is coupled to the output O1. In such a manner, the processor 904 continues to control the capacitor Cs until the parameter is within the pre-determined range. On the other hand, upon determining that the parameter is within the pre-determined range, the processor 904 does not send a command signal to the driver D1. When the command signal is not received by the driver D1, the driver D1 does not generate the current signal and the capacitance of the capacitor Cs does not change.

FIG. 6B is a diagram of an embodiment of a system 610 to illustrate a change in an inductance of the inductor Lvs of the shunt circuit 532 until the parameter is within a pre-determined span. The system 610 includes the IMC 106, the VI probe 110, the shunt circuit 532, the motor M1, the driver D1, and the host computer 902. The motor M1 is coupled via a connection mechanism to the inductor Lvs.

The processor 904 receives a measurement of the parameter from the VI probe 110 coupled to the output O1 and determines whether the parameter is within the pre-determined span. Upon determining that the parameter is not within the pre-determined span, the processor 904 sends a command signal to the driver D1. Upon receiving the command signal, the driver D1 generates a current signal to send to the motor M1. The motor M1 operates to change an inductance of the inductor Lvs. For example, when the stator of the motor M1 receives the current signal, the rotor of the motor M1 rotates to change an amount by which a core of the inductor Lvs is surrounded by windings of the inductor Lvs. The change in the inductance of the inductor Lvs changes the parameter measured by the VI probe 110 that is coupled to the output O1. The processor 904 continues to control the inductor Lvs until the parameter is within the pre-determined span. On the other hand, upon determining that the parameter is within the pre-determined span, the processor 904 does not send a command signal to the driver D1. When the command signal is not received by the driver D1, the driver D1 does not generate the current signal and the inductance of the inductor Lvs does not change.

FIG. 6C is a diagram of an embodiment of a system 620 to illustrate a change in a capacitance of the capacitor Cs and an inductance of the inductor Lvs of the shunt circuit 542 until the parameter is within a pre-determined extent. The system 620 includes the IMC 106, the VI probe 110, the shunt circuit 542, the motor M1, the driver D1, a motor M2, a driver D2, and the host computer 902. The motor M2 is coupled via a connection mechanism to the capacitor Cs. Moreover, the driver D2 is coupled to the motor M2 and is coupled to the processor 904.

The processor 904 receives a measurement of the parameter from the VI probe 110 coupled to the output O1 and determines whether the parameter is within the pre-determined extent. Upon determining that the parameter is not within the pre-determined extent, the processor 904 sends command signals to the drivers D1 and D2. Upon receiving one of the command signals, the driver D1 generates a current signal to send to the motor M1 and upon receiving another one of the command signals, the driver D2 generates a current signal to send to the motor M2. The motor M1 operates to change an inductance of the inductor Lvs and the motor M2 operates to change a capacitance of the capacitor Cs. For example, when the stator of the motor M1 receives the current signal, the rotor of the motor M1 rotates to change an amount by which a core of the inductor Lvs is surrounded by windings of the inductor Lvs. The change in the inductance of the inductor Lvs changes the parameter measured by the VI probe 110 that is coupled to the output O1. Also, when a stator of the motor M2 receives the current signal, a rotor of the motor M2 rotates to change an area between two parallel plates of the capacitor Cs or to change a distance between the two plates. The change in the capacitance of the capacitor Cs changes the parameter measured by the VI probe 110 that is coupled to the output O1. The processor 904 continues to control the inductor Lvs and the capacitor Cs until the parameter is within the pre-determined extent. On the other hand, upon determining that the parameter is within the pre-determined extent, the processor 904 does not send the command signals to the drivers D1 and D2. When the command signal is not received by the driver D1, the driver D1 does not generate the current signal and the inductance of the inductor Lvs does not change. Similarly, when the command signal is not received by the driver D2, the driver D2 does not generate the current signal and the capacitance of the capacitor Cs does not change.

Figures 6D, 6E:
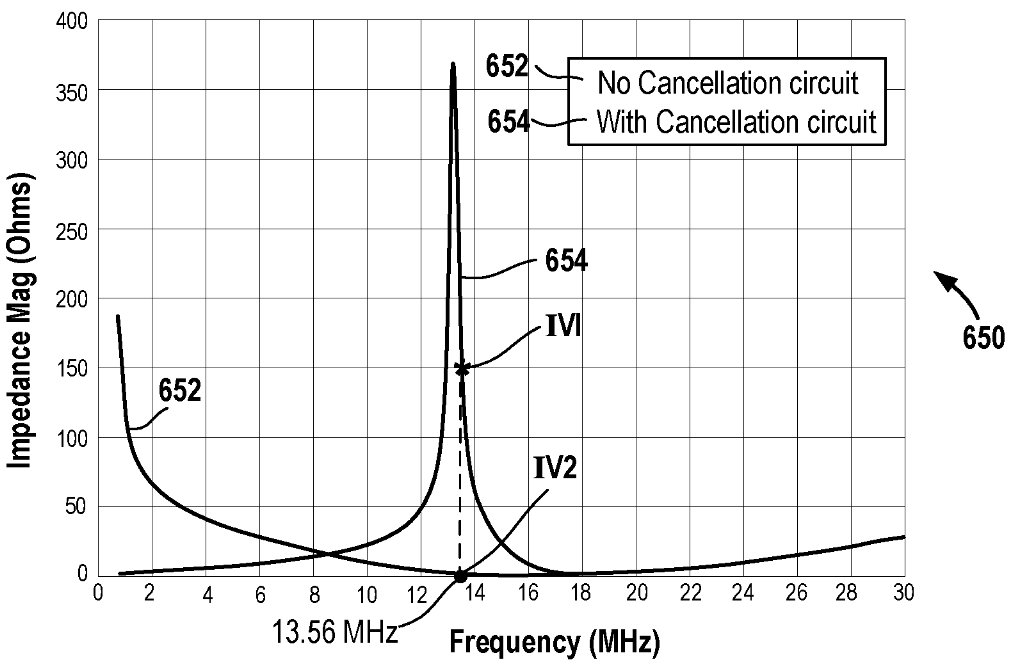
FIG. 6D is an embodiment of a graph to illustrate a difference in impedances with and without use of a shunt circuit.
FIG. 6E is an embodiment of a table to illustrate measurements by a voltage and current (VI) probe of voltage, current, phase, and power of a radio frequency signal at an output of an impedance matching circuit without use of a shunt circuit and with use of the shunt circuit.

FIG. 6D is an embodiment of a graph 650 to illustrate a difference in impedances with and without use of a shunt circuit. The graph 650 plots a magnitude of impedance calculated from voltage and current measured using the VI probe 110 at the output O1 (FIG. 1A) of the IMC 106 (FIG. 1A) versus a frequency of the RF generator 104 (FIG. 1A). The graph 650 has two plots 652 and 654. The plot 652 represents impedance calculated from voltage and current measured using the VI probe 110 at the output O1 when the shunt circuit, e.g., the shunt circuit 108 or the shunt circuit 502 or the shunt circuit 512 or the shunt circuit 532 or the shunt circuit 542 (FIGS. 5A-5E), is not connected to the point P1. Moreover, the plot 654 represents impedance calculated from voltage and current measured using the VI probe 110 at the output O1 when the shunt circuit is connected to the point P1. The plot 654 represents impedance associated with parasitic paths, e.g., an impedance associated with the parasitic capacitances C11*f* and C12*f*, an impedance associated with the parasitic capacitances C11*c* and C12*c*. An impedance value IV1 plotted on the plot 654 is greater than an impedance value IV2 plotted on the plot 652. Both the impedance values IV1 and IV2 corresponding to a frequency of operation of 13.56 MHz of the RF generator 104. For example, both the impedance values are measured when the RF generator 104 operates at the frequency of 13.56 MHz.

In some embodiments, the shunt circuit is referred to herein as a cancellation circuit.

FIG. 6E is an embodiment of a table 660 to illustrate measurements by the VI probe 110 of voltage, current, phase, and power of the RF signal measured by the VI probe 110 at the output O1 without use of a shunt circuit and with use of the shunt circuit. The table 660 includes a column 1 showing a voltage of the modified RF signal at the output O1, a current of the modified RF signal at the output O1, a phase of the modified RF signal at the output O1, and a power of the modified RF signal at the output O1. A column 2 of the table 660 is generated when the shunt circuit is not connected to the point P1.

Moreover, the table 660 includes a column 3 showing a voltage of the modified RF signal at the output O1, a current of the modified RF signal at the output O1, a phase of the modified RF signal at the output O1, and a power of the modified RF signal at the output O1. The column 3 is generated when the shunt circuit is connected to the point P1 and the capacitance of the capacitor Cs is 4 picoFarads.

Also, the table 660 includes a column 4 showing a voltage of the modified RF signal at the output O1, a current of the modified RF signal at the output O1, a phase of the modified RF signal at the output O1, and a power of the modified RF signal at the output O1. The column 4 is generated when the shunt circuit is connected to the point P1 and the capacitance of the capacitor Cs is 70 picoFarads.

It should be noted that there is an increase in voltage of the modified RF signal at the output O1 with use of the shunt circuit compared to voltage of the modified RF signal at the output O1 when the shunt circuit is not used. Moreover, there is a decrease in a current of the modified RF signal at the output O1 with use of the shunt circuit compared to RF current of the modified RF signal at the output O1 when the shunt circuit is not used. Also, there is a decrease in a phase of the modified RF signal at the output O1 with use of the shunt circuit compared to a phase of the modified RF signal at the output O1 when the shunt circuit is not used. There is an increase in power at the output O1 with use of the shunt circuit compared to power of the modified RF signal at the output O1 when the shunt circuit is not used.

Figure 7:
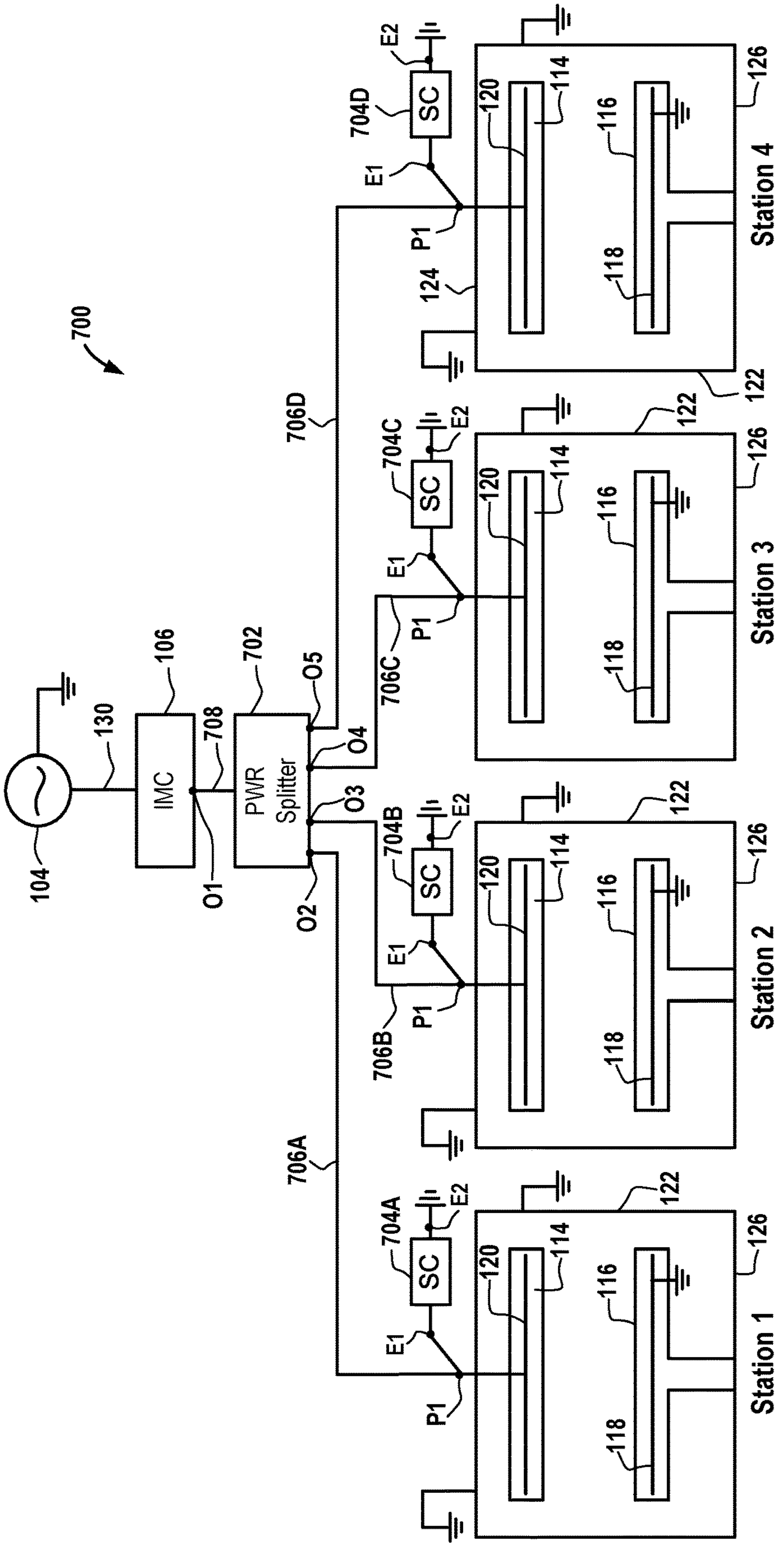
FIG. 7 is a diagram of an embodiment of a system for illustrating use of a shunt circuit with each of the stations.

FIG. 7 is a diagram of an embodiment of a system 700 for illustrating use of a shunt circuit with each of the stations 1 through 4. The system 700 includes the RF generator 104, the IMC 106, a power splitter 702, the stations 1 through 4, and shunt circuits 704A, 704B, 704C, and 704D. An example of the power splitter 702 is provided in application Ser. No. 15/254,769, filed on Sep. 9, 2016, and titled "COMBINER AND DISTRIBUTOR FOR ADJUSTING IMPEDANCES OR POWER ACROSS MULTIPLE PLASMA PROCESSING STATIONS", which is incorporated by reference herein in its entirety. As an illustration, the power splitter 702 includes a network of inductors, or capacitors, or resistors, or a combination of two or more thereof, to distribute, e.g., split, power of the modified RF signal to output multiple modified RF output signals.

The IMC 106 is coupled to the power splitter 702 via an RF cable 708. The power splitter 702 is coupled to the top electrode 120 of the station 1 via an RF transmission line 706A, is coupled to the top electrode 120 of the station 2 via an RF transmission line 706B, is coupled to the top electrode 120 of the station 3 via an RF transmission line 706C, and is coupled to the top electrode 120 of the station 4 via an RF transmission line 706D. The RF transmission line 706A is coupled to an output O2 of the power splitter 702. Similarly, the RF transmission line 706B is coupled to an output O3 of the power splitter 702, the RF transmission line 706C is coupled to an output O4 of the power splitter 702, and the RF transmission line 704D is coupled to an output O5 of the power splitter 702. As an example, the output O2 is coupled to a first branch circuit of the power splitter 702, the output O3 is coupled to a second branch circuit of the power splitter 702, the output O4 is coupled to a third branch circuit of the power splitter 702, and the output O5 is coupled to a fourth branch circuit of the power splitter 702. In some embodiments, each branch circuit of the power splitter 702 includes a network of circuit components, e.g., inductors, capacitors, resistors, etc., that are coupled to each other. The branches of the power splitter 702 connect to each other to receive the modified RF signal from the IMC 106 and to split power of the modified RF signal.

The shunt circuit 704A is coupled to the RF transmission line 706A at the point P1 on the RF transmission line 706A. Similarly, the shunt circuit 704B is coupled to the RF transmission line 706B at the point P1 on the RF transmission line 706B, the shunt circuit 704C is coupled to the RF transmission line 706C at the point P1 on the RF transmission line 706C, and the shunt circuit 704D is coupled to the RF transmission line 706A at the point P1 on the RF transmission line 706D.

Moreover, the end E1 of the shunt circuit 704A is coupled to the point P1 on the RF transmission line 706A and the end E2 of the shunt circuit 704A is coupled to housing of the station 1, e.g., the outer surface 125 of the ceiling 124 of the station 1, to be coupled to the ground potential. Similarly, the end E1 of the shunt circuit 704B is coupled to the point P1 on the RF transmission line 706B and the end E2 of the shunt circuit 704B is coupled to housing of the station 2, e.g., the outer surface 125 of the ceiling 124 of the station 2, to be coupled to the ground potential. The end E1 of the shunt circuit 704C is coupled to the point P1 on the RF transmission line 706C and the end E2 of the shunt circuit 704C is coupled to housing of the station 3, e.g., the outer surface 125 of the ceiling 124 of the station 3, to be coupled to the ground potential. Similarly, the end E1 of the shunt circuit 704D is coupled to the point P1 on the RF transmission line 706D and the end E2 of the shunt circuit 704D is coupled to housing of the station 4, e.g., the outer surface 125 of the ceiling 124 of the station 4, to be coupled to the ground potential.

Each of the RF transmission lines 706A, 706B, 706C, and 706D is an example of the RF transmission line 132 (FIG. 1A). In some embodiments, each of the RF transmission lines 706A, 706B, 706C, and 706D is an example of the RF transmission line 154 (FIG. 1B).

Moreover, the shunt circuit 502 (FIG. 5A) is an example of each of the shunt circuits 704A, 704B, 704C, and 704D.

In some embodiments, the shunt circuit 512 (FIG. 5B) is an example of each of the shunt circuits 704A, 704B, 704C, and 704D. In various embodiments, the shunt circuit 108 (FIG. 5C) is an example of each of the shunt circuits 704A, 704B, 704C, and 704D. In several embodiments, the shunt circuit 532 (FIG. 5D) is an example of each of the shunt circuits 704A, 704B, 704C, and 704D. In some embodiments, the shunt circuit 542 (FIG. 5E) is an example of each of the shunt circuits 704A, 704B, 704C, and 704D.

The modified RF signal that is output at the output O1 of the IMC 106 is provided to the power splitter 702. The power splitter 702 splits power of the modified RF signal to generate the multiple modified RF output signals. For example, one of the RF output signals is sent via the RF transmission line 706A to the top electrode 120 of the station 1. Another one of the modified RF output signals is sent via the RF transmission line 706B to the top electrode 120 of the station 2. Yet another one of the modified RF output signals is sent via the RF transmission line 706C to the top electrode 120 of the station 3. Another one of the modified RF output signals is sent via the RF transmission line 706D to the top electrode 120 of the station 4.

The shunt circuit 704A increases an impedance generated as a result of a parasitic capacitance of the station 1 to improve an efficiency and yield of a plasma process performed on the wafer 112 at the station 1. Similarly, the shunt circuit 704B increases an RF voltage at the point P1 on the RF transmission line 706B to increase an impedance the point P1 so that an effect of a parasitic capacitance of the station 2 is reduced. Moreover, the shunt circuit 704C increases an RF voltage at the point P1 on the RF transmission line 706C and reduces an RF current at the point P1 on the RF transmission line 706C to increase an impedance at the point P1 on the RF transmission line 706C. Also, the shunt circuit 704D increases an impedance at the point P1 to direct, e.g., increase, power of the modified RF output signal towards the gap between the showerhead 114 and the pedestal 116.

Figure 8A:
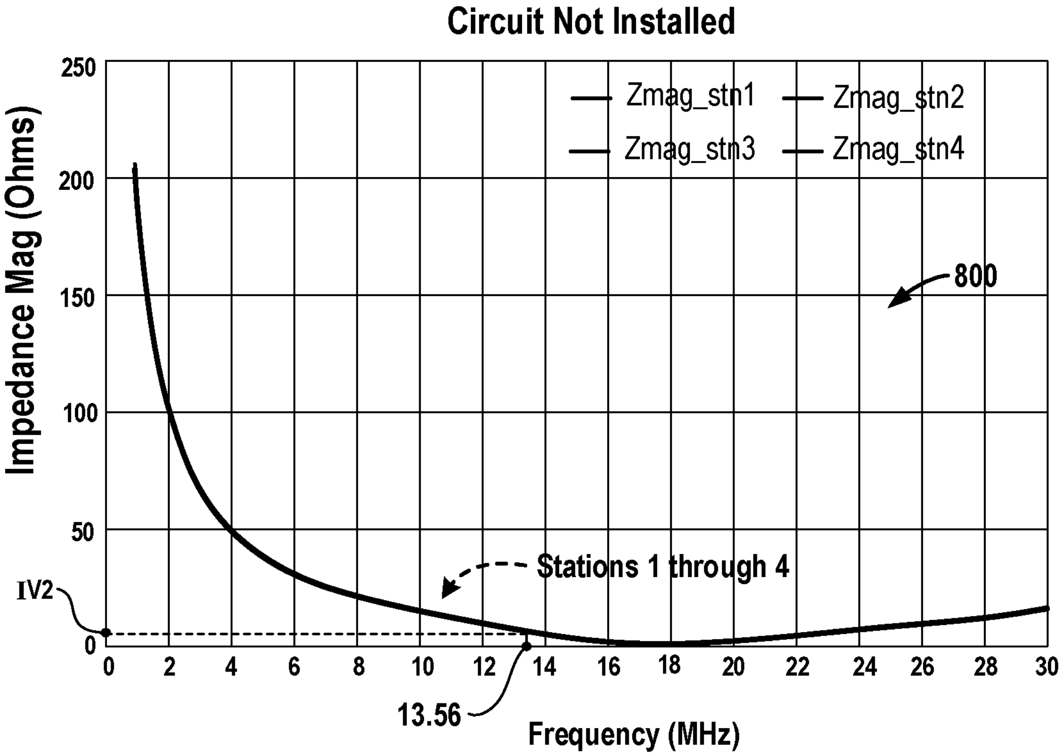
FIG. 8A is an embodiment of a graph to illustrate impedances associated with parasitic capacitances within the stations when a shunt circuit is not used with any of the stations.

FIG. 8A is an embodiment of a graph 800 to illustrate impedance associated with parasitic capacitance within the stations 1 through 4 when a shunt circuit is not used with any of the stations 1 through 4. The graph 800 plots a magnitude of the impedance associated with parasitic capacitance on a y-axis and a frequency of operation of the RF generator 104 (FIG. 1A) on an x-axis. As shown, for the frequency of operation of 13.56 MHz, the impedance associated with parasitic capacitance at each of the stations 1 through 4 is IV2, which is low.

Figure 8B:
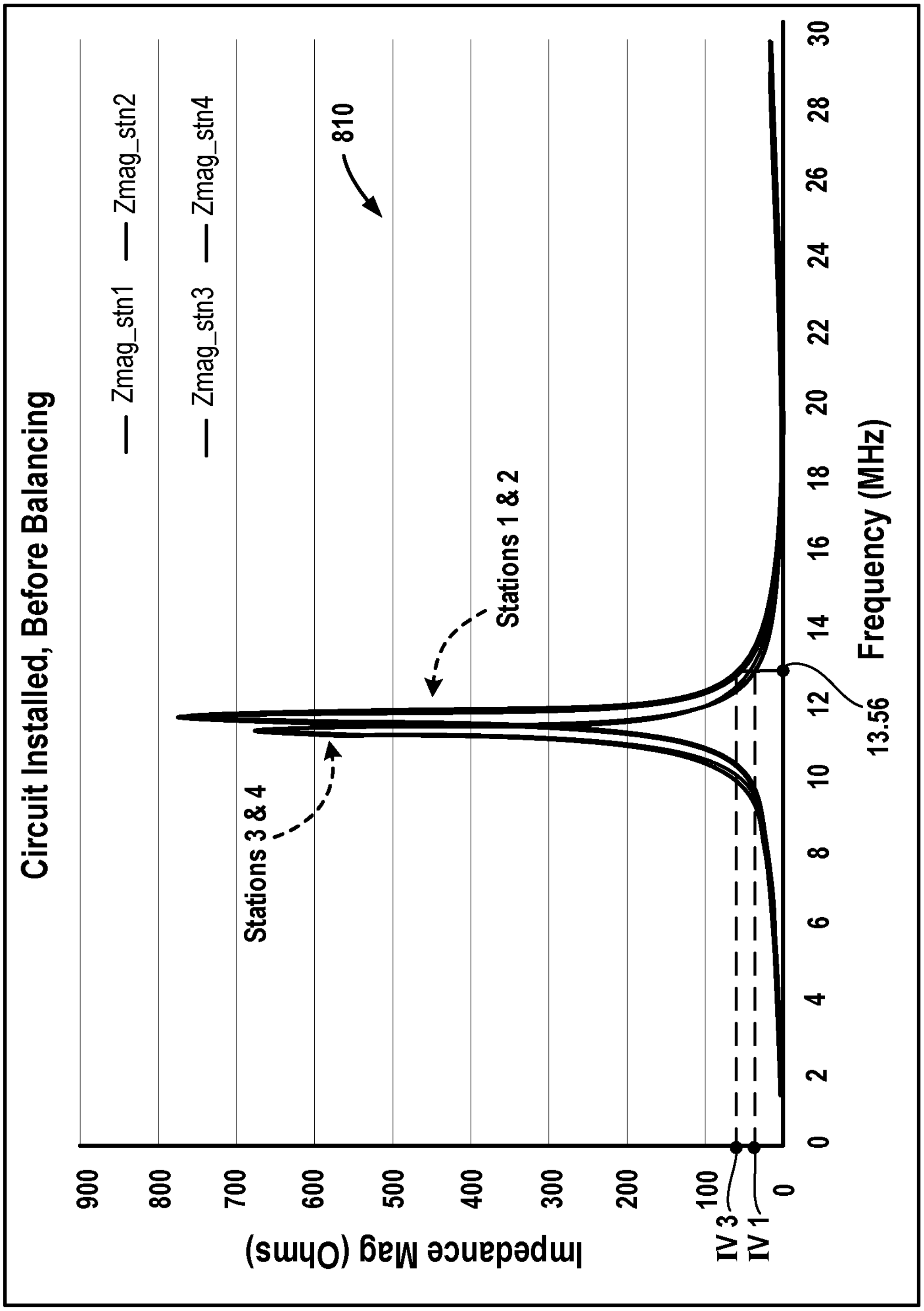
FIG. 8B is an embodiment of a graph to illustrate negation of impedances associated with parasitic capacitances within the stations when a shunt circuit is used with the stations.

FIG. 8B is an embodiment of a graph 810 to illustrate a negation of impedance associated with parasitic capacitance within the stations 1 through 4 when a shunt circuit is used with the stations 1 through 4. When a shunt circuit is coupled to the stations 3 and 4, as shown above, the impedance value IV2 increases to IV1. Similarly, when a shunt circuit is coupled to the stations 1 and 2, as shown above, the impedance value IV2 increases to IV3. As such, by increasing impedance associated with parasitic capacitances associated with the stations 1 through 4, there is an increase RF power used to process the wafer 112 at the stations 1 through 4.

FIG. 8C is an embodiment of a table 820 to illustrate an amount of voltage associated with parasitic capacitance at each of the stations 1 through 4 when a shunt circuit is not used with any of the stations 1 through 4. The table 820 has a voltage measured at the output O2 of the power splitter 702 (FIG. 7), a voltage measured at the output O3 of the power splitter 702, a voltage measured at the output O4 of the power splitter 702, and a voltage measured at the output O5 of the power splitter 702.

Moreover, the table 820 has a current measured at the output O2 of the power splitter 702, a current measured at the output O3 of the power splitter 702, a current measured at the output O4 of the power splitter 702, and a current measured at the output O5 of the power splitter 702. Also, the table 820 plots a phase and power of the modified output RF signal at the output O2, a phase and power of the modified output RF signal at the output O3, a phase and power of the modified output RF signal at the output O4, and a phase and power of the modified output RF signal at the output O5.

FIG. 8D is an embodiment of a table 840 to illustrate a change in voltages, currents, phases, and power when a shunt circuit is used at the stations 1 through 4. As illustrate, voltage at the outputs O2 through O5 increases when the shunt circuit is used at each of the stations 1 through 4 compared to when the shunt circuit is not used. Moreover, there is a decrease in currents at the outputs O2 through O5 when the shunt circuit is used at each of the stations 1 through 4 compared to when the shunt circuit is not used. Also, there is an increase in power of the modified RF output signals at the outputs O2 through O5 when the shunt circuit is used at each of the stations 1 through 4 compared to when the shunt circuit is not used.

FIG. 9A is a diagram of an embodiment of a multi-station system 900 for negating impedances associated with parasitic capacitances of the stations 1 through 4 by modifying capacitances of the capacitors Cs of the shunt circuit 108. The multi-station system 900 includes the power splitter 702, multiple VI probes 110, multiple shunt circuits 108, multiple motors M1, M2, M3, and M4, multiple drivers D1, D2, D3, and D4, and the host computer 902. Examples of the host computer 902 include a laptop computer, a desktop computer, a cell phone, or a tablet. Examples of each driver, described herein, includes one or more transistors. Examples of each motor, described herein, includes a direct current (DC) motor, an alternating current (AC) motor, an electric motor, etc. The host computer 902 includes the processor 904 that is coupled to the memory device 906.

The VI probe 110 is coupled to the output O2, another VI probe 110 is coupled to the output O3, yet another VI probe 110 is coupled to the output O4, and another VI probe 110 is coupled to the output O5. Moreover, the processor 904 is coupled to the drivers D1 through D4. The driver D1 is coupled to the motor M1. Similarly, the driver D2 is coupled to the motor M2, the driver D3 is coupled to the motor M3 and the driver D4 is coupled to the motor M4.

The motor M1 is coupled via a connection mechanism, e.g., one or more rods, a combination of one or more rods and one or more gears, etc., to the capacitor Cs of the shunt circuit 108 coupled to the point P1 on the RF transmission line 706A. Similarly, the motor M2 is coupled via a connection mechanism to the capacitor Cs of the shunt circuit 108 coupled to the point P1 on the RF transmission line 706B, the motor M3 is coupled via a connection mechanism to the capacitor Cs of the shunt circuit 108 coupled to the point P1 on the RF transmission line 706C, and the motor M4 is coupled via a connection mechanism to the capacitor Cs of the shunt circuit 108 coupled to the point P1 on the RF transmission line 706D.

Also, the processor 904 is coupled to each of the VI probes 110 that are coupled to the outputs O2 through O5. For example, the processor 904 is coupled to the VI probe 110, coupled to the output O2, via a transfer cable, e.g., a serial transfer cable for transferring measurements in a serial order, a parallel transfer cable for transferring measurements in a parallel manner, a universal serial bus (USB) cable for transferring the measurements, etc. As another example, the processor 904 is coupled to the VI probe 110, coupled to the output O3, via a transfer cable. Moreover, the processor 904 is coupled to the VI probe 110, coupled to the output O4, via a transfer cable, and the processor 904 is coupled to the VI probe 110, coupled to the output O5, via a transfer cable.

The processor 904 receives a measurement of the parameter, e.g., voltage, current, power, impedance, etc., from the VI probe 110 coupled to the RF transmission line 706A and determines whether the parameter is within a first pre-determined range. Upon determining that the parameter is not within the first pre-determined range, the processor 904 sends a command signal to the driver D1. Upon receiving the command signal, the driver D1 generates a current signal to send to the motor M1. The motor M1 operates to change a capacitance of the capacitor Cs coupled to the station 1. For example, when the stator of the motor M1 receives the current signal, the rotor of the motor M1 rotates to change an area between two parallel plates of the capacitor Cs that is coupled to the point P1 on the RF transmission line 706A or to change a distance between the two plates. The change in the capacitance of the capacitor Cs changes the parameter measured by the VI probe 110 that is coupled to the output O2. In such a manner, the processor 904 continues to control the capacitor Cs coupled to the station 1 until the parameter is within the first pre-determined range. On the other hand, upon determining that the parameter is within the first pre-determined range, the processor 904 does not send a command signal to the driver D1. When the command signal is not received by the driver D1, the driver D1 does not generate the current signal and the capacitance of the capacitor Cs coupled to the station 1 does not change.

Similarly, the processor 904 receives a measurement of the parameter from the VI probe 110 coupled to the RF transmission line 706B and determines whether the parameter is within a second pre-determined range. Upon determining that the parameter is not within the second pre-determined range, the processor 904 sends a command signal to the driver D2. Upon receiving the command signal, the driver D2 generates a current signal to send to the motor M2. The motor M2 operates to change a capacitance of the capacitor Cs coupled to the station 2. The change in the capacitance of the capacitor Cs changes the parameter measured by the VI probe 110 that is coupled to the output O3. In such a manner, the processor 904 continues to control the capacitor Cs coupled to the station 2 until the parameter is within the second pre-determined range. On the other hand, upon determining that the parameter is within the second pre-determined range, the processor 904 does not send a command signal to the driver D2. When the command signal is not received by the driver D2, the driver D2 does not generate the current signal and the capacitance of the capacitor Cs coupled to the station 2 does not change.

Also, the processor 904 receives a measurement of the parameter from the VI probe 110 coupled to the RF transmission line 706C and determines whether the parameter is within a third pre-determined range. Upon determining that the parameter is not within the third pre-determined range, the processor 904 sends a command signal to the driver D3. Upon receiving the command signal, the driver D3 generates a current signal to send to the motor M3. The motor M3 operates to change a capacitance of the capacitor Cs coupled to the station 3. The change in the capacitance of the capacitor Cs changes the parameter measured by the VI probe 110 that is coupled to the output O4. In such a manner, the processor 904 continues to control the capacitor Cs coupled to the station 3 until the parameter is within the third pre-determined range. On the other hand, upon determining that the parameter is within the third pre-determined range, the processor 904 does not send a command signal to the driver D3. When the command signal is not received by the driver D3, the driver D3 does not generate the current signal and the capacitance of the capacitor Cs coupled to the station 3 does not change.

Furthermore, the processor 904 receives a measurement of the parameter from the VI probe 110 coupled to the RF transmission line 706D and determines whether the parameter is within a fourth pre-determined range. Upon determining that the parameter is not within the fourth pre-determined range, the processor 904 sends a command signal to the driver D4. Upon receiving the command signal, the driver D4 generates a current signal to send to the motor M4. The motor M4 operates to change a capacitance of the capacitor Cs coupled to the station 4. The change in the capacitance of the capacitor Cs changes the parameter measured by the VI probe 110 that is coupled to the output O5. In such a manner, the processor 904 continues to control the capacitor Cs coupled to the station 4 until the parameter is within the fourth pre-determined range. On the other hand, upon determining that the parameter is within the fourth pre-determined range, the processor 904 does not send a command signal to the driver D4. When the command signal is not received by the driver D4, the driver D4 does not generate the current signal and the capacitance of the capacitor Cs coupled to the station 4 does not change. When the first pre-determined range is the same as the second pre-determined range, the third pre-determined range, and the fourth pre-determined range, balancing is performed in which the parameter, e.g., power, is balanced, that is measured by the VI probes 110 coupled to the outputs O2 through O5 is within a single pre-determined range.

In some embodiments, the first pre-determined range is different from one or more of the second pre-determined range, the third pre-determined range, and the fourth pre-determined range.

In various embodiments, a capacitance of the capacitor Cs of the shunt circuit 108 coupled to the RF transmission line 706A is modified manually until the parameter measured by the VI probe 110 coupled to the output O2 is within the first pre-determined range. Similarly, a capacitance of the capacitor Cs of the shunt circuit 108 coupled to the RF transmission line 706B is changed by a person until the parameter measured by the VI probe 110 coupled to the output O3 is within the second pre-determined range. Also, a capacitance of the capacitor Cs of the shunt circuit 108 coupled to the RF transmission line 706C is controlled manually until the parameter measured by the VI probe 110 coupled to the output O4 is within the third pre-determined range. Moreover, a capacitance of the capacitor Cs of the shunt circuit 108 coupled to the RF transmission line 706D is modified manually until the parameter measured by the VI probe 110 coupled to the output O5 is within the fourth pre-determined range.

In some embodiments, capacitances of the capacitors Cs of the shunt circuits 108 coupled to the RF transmission lines 706A through 706D are changed manually until the parameter measured by the VI probes 110 coupled to the outputs O2 through O5 are balanced to be within the single pre-determined range, e.g., the first pre-determined range or the second pre-determined range or the third pre-determined range or the fourth pre-determined range.

FIG. 9B is a diagram of an embodiment of a multi-station system 920 for negating impedances associated with parasitic capacitances of the stations 1 through 4 by changing inductances of the inductors Lvs of the shunt circuits 532. The multi-station system 920 is the same as the multi-station system 900 of FIG. 9A except that the multi-station system 920 includes the shunt circuits 532 coupled to the points P1 of the RF transmission lines 706A through 706D. Moreover, in the system 920, the motors M1 through M4 are coupled to the inductors Lvs instead of being coupled to the capacitors Cs of the system 900.

The multi-station system 920 includes the shunt circuit 532 coupled to the point P1 on the RF transmission line 706A. Moreover, the multi-station system 920 has the shunt circuit 532 coupled to the point P1 on the RF transmission line 706B, the shunt circuit 532 coupled to the point P1 on the RF transmission line 706C, and the shunt circuit 532 coupled to the point P1 on the RF transmission line 706D. The motor M1 is coupled via a connection mechanism to the inductor Lvs of the shunt circuit 532 coupled to the point P1 on the RF transmission line 706A. Similarly, the motor M2 is coupled via a connection mechanism to the inductor Lvs of the shunt circuit 532 coupled to the point P1 on the RF transmission line 706B, the motor M3 is coupled via a connection mechanism to the inductor Lvs of the shunt circuit 532 coupled to the point P1 on the RF transmission line 706C, and the motor M1 is coupled via a connection mechanism to the inductor Lvs of the shunt circuit 532 coupled to the point P1 on the RF transmission line 706D.

The processor 904 receives a measurement of the parameter from the VI probe 110 coupled to the RF transmission line 706A and determines whether the parameter is within a first pre-determined span. Upon determining that the parameter is not within the first pre-determined span, the processor 904 sends a command signal to the driver D1. Upon receiving the command signal, the driver D1 generates a current signal to send to the motor M1. The motor M1 operates to change an inductance of the inductor Lvs coupled to the station 1. For example, when a stator of the motor M1 receives the current signal, a rotor of the motor rotates to change a position of the core of the inductor Lvs that is coupled to the point P1 on the RF transmission line 706A. The position of the core is changed with respect to windings of the inductor Lvs that is coupled to the point P1 on the RF transmission line 706A. The change in the inductance of the inductor Lvs changes the parameter measured by the VI probe 110 that is coupled to the output O2. In such a manner, the processor 904 continues to control the inductor Lvs coupled to the station 1 until the parameter is within the first pre-determined span. On the other hand, upon determining that the parameter is within the first pre-determined span, the processor 904 does not send a command signal to the driver D1. When the command signal is not received by the driver D1, the driver D1 does not generate the current signal and the inductance of the inductor Lvs coupled to the station 1 does not change.

Similarly, the processor 904 receives a measurement of the parameter from the VI probe 110 coupled to the RF transmission line 706B and determines whether the parameter is within a second pre-determined span. Upon determining that the parameter is not within the second pre-determined span, the processor 904 sends a command signal to the driver D2. Upon receiving the command signal, the driver D2 generates a current signal to send to the motor M2. The motor M2 operates to change an inductance of the inductor Lvs coupled to the station 2. The change in the inductance of the inductor Lvs changes the parameter measured by the VI probe 110 that is coupled to the output O3. In such a manner, the processor 904 continues to control the inductor Lvs coupled to the station 2 until the parameter is within the second pre-determined span. On the other hand, upon determining that the parameter is within the second pre-determined span, the processor 904 does not send a command signal to the driver D2. When the command signal is not received by the driver D2, the driver D2 does not generate the current signal and the inductance of the inductor Lvs coupled to the station 2 does not change.

Moreover, the processor 904 receives a measurement of the parameter from the VI probe 110 coupled to the RF transmission line 706C and determines whether the parameter is within a third pre-determined span. Upon determining that the parameter is not within the third pre-determined span, the processor 904 sends a command signal to the driver D3. Upon receiving the command signal, the driver D3 generates a current signal to send to the motor M3. The motor M3 operates to change an inductance of the inductor Lvs coupled to the station 3. The change in the inductance of the inductor Lvs changes the parameter measured by the VI probe 110 that is coupled to the output O4. In such a manner, the processor 904 continues to control the inductor Lvs coupled to the station 3 until the parameter is within the third pre-determined span. On the other hand, upon determining that the parameter is within the third pre-determined span, the processor 904 does not send a command signal to the driver D3. When the command signal is not received by the driver D3, the driver D3 does not generate the current signal and the inductance of the inductor Lvs coupled to the station 3 does not change.

Furthermore, the processor 904 receives a measurement of the parameter from the VI probe 110 coupled to the RF transmission line 706D and determines whether the parameter is within a fourth pre-determined span. Upon determining that the parameter is not within the fourth pre-determined span, the processor 904 sends a command signal to the driver D4. Upon receiving the command signal, the driver D4 generates a current signal to send to the motor M4. The motor M4 operates to change an inductance of the inductor Lvs coupled to the station 4. The change in the inductance of the inductor Lvs changes the parameter measured by the VI probe 110 that is coupled to the output O5. In such a manner, the processor 904 continues to control the inductor Lvs coupled to the station 4 until the parameter is within the fourth pre-determined span. On the other hand, upon determining that the parameter is within the fourth pre-determined span, the processor 904 does not send a command signal to the driver D4. When the command signal is not received by the driver D4, the driver D4 does not generate the current signal and the inductance of the inductor Lvs coupled to the station 4 does not change.

In some embodiments, the first pre-determined span is different from one or more of the second pre-determined span, the third pre-determined span, and the fourth pre-determined span.

In several embodiments, the first pre-determined span is the same as the second pre-determined span, the third pre-determined span, and the fourth pre-determined span. In these embodiments, when the first pre-determined span is the same as the second pre-determined span, the third pre-determined span, and the fourth pre-determined span, the parameter measured at the outputs O2 through O5 is balanced.

In various embodiments, an inductance of the inductor Lvs of the shunt circuit 532 coupled to the RF transmission line 706A is modified manually until the parameter measured by the VI probe 110 coupled to the output O2 is within the first pre-determined span. Similarly, an inductance of the inductor Lvs of the shunt circuit 532 coupled to the RF transmission line 706B is changed by a person until the parameter measured by the VI probe 110 coupled to the output O3 is within the second pre-determined span. Also, an inductance of the inductor Lvs of the shunt circuit 532 coupled to the RF transmission line 706C is controlled manually until the parameter measured by the VI probe 110 coupled to the output O4 is within the third pre-determined span. Moreover, an inductance of the inductor Lvs of the shunt circuit 532 coupled to the RF transmission line 706D is modified manually until the parameter measured by the VI probe 110 coupled to the output O5 is within the fourth pre-determined span.

In some embodiments, inductances of the inductors Lvs of the shunt circuits 532 coupled to the RF transmission lines 706A through 706D are changed manually until the parameter measured by the VI probes 110 coupled to the outputs O2 through O5 are balanced to be within the single pre-determined span, e.g., the first pre-determined span or the second pre-determined span or the third pre-determined span or the fourth pre-determined span.

Figure 9C:
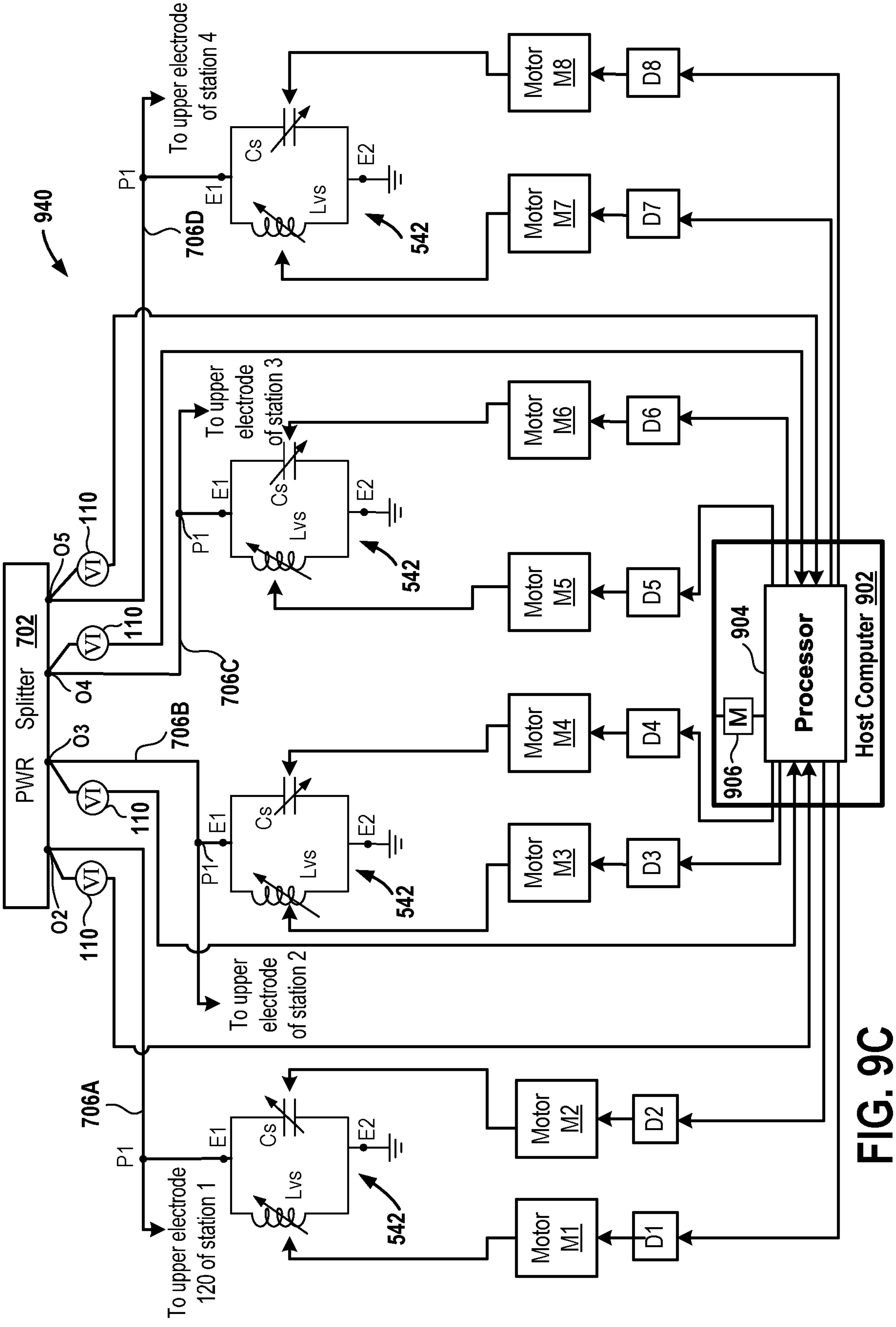
FIG. 9C is a diagram of an embodiment of a multi-station system for negating impedances associated with parasitic capacitances of the stations by changing inductances of inductors and capacitors of shunt circuits used within the multi-station system.

FIG. 9C is a diagram of an embodiment of a multi-station processing system 940 for negating impedances associated with parasitic capacitances of the stations 1 through 4 by changing inductance of the inductors Lvs and capacitors Cs of the shunt circuits 542. The system 940 is the same as the system 920 of FIG. 9B except that the system 940 includes the shunt circuits 542 coupled to the points P1 of the RF transmission lines 706A through 706D. Moreover, the system 940 includes the motors M1 through M4, and additional motors M5, M6, M7, and M8. Also, the system 940 includes the drivers D1 through D4, and additional drivers D5, D6, D7, and D8.

The shunt circuit 542 is coupled at its end E1 to the point P1 on the RF transmission line 706A. Similarly, the shunt circuit 542 is coupled at its end E1 to the point P1 on the RF transmission line 706B, the shunt circuit 542 is coupled at its end E1 to the point P1 on the RF transmission line 706C, and the shunt circuit 542 is coupled at its end E1 to the point P1 on the RF transmission line 706D.

The motor M1 is coupled via a connection mechanism to the inductor Lvs of the shunt circuit 542 coupled to the point P1 on the RF transmission line 706A. In a similar manner, the motor M3 is coupled via a connection mechanism to the inductor Lvs of the shunt circuit 542 coupled to the point P1 on the RF transmission line 706B, the motor M5 is coupled via a connection mechanism to the inductor Lvs of the shunt circuit 542 coupled to the point P1 on the RF transmission line 706C, and the motor M7 is coupled via a connection mechanism to the inductor Lvs of the shunt circuit 542 coupled to the point P1 on the RF transmission line 706D.

The motor M2 is coupled via a connection mechanism to the capacitor Cs of the shunt circuit 542 coupled to the point P1 on the RF transmission line 706A. In a similar manner, the motor M4 is coupled via a connection mechanism to the capacitor Cs of the shunt circuit 542 coupled to the point P1 on the RF transmission line 706B, the motor M6 is coupled via a connection mechanism to the capacitor Cs of the shunt circuit 542 coupled to the point P1 on the RF transmission line 706C, and the motor M8 is coupled via a connection mechanism to the capacitor Cs of the shunt circuit 542 coupled to the point P1 on the RF transmission line 706D.

Furthermore, the driver D1 is coupled to the motor M1, the driver D2 is coupled to the motor M2, the driver D3 is coupled to the motor M3, and the driver D4 is coupled to the motor M4. Similarly, the driver D5 is coupled to the motor M5, the driver D6 is coupled to the motor M6, the driver D7 is coupled to the motor M7, and the driver D8 is coupled to the motor M8. The processor 904 is coupled to the drivers D1 through D8.

The processor 904 receives a measurement of the parameter from the VI probe 110 coupled to the RF transmission line 706A and determines whether the parameter is within a first pre-determined extent. Upon determining that the parameter is not within the first pre-determined extent, the processor 904 sends command signals to the drivers D1 and D2. Upon receiving one of the command signals, the driver D1 generates a current signal to send to the motor M1. The motor M1 operates to change an inductance of the inductor Lvs coupled to the station 1. Similarly, upon receiving another one of the command signals, the driver D2 generates a current signal to send to the motor M2. The motor M2 operates to change a capacitance of the capacitor Cs coupled to the station 1. The change in the inductance of the inductor Lvs coupled to the station 1 and the capacitance of the capacitor Cs coupled to the station 1 changes the parameter measured by the VI probe 110 that is coupled to the output O2. In such a manner, the processor 904 continues to control the inductor Lvs coupled to the station 1 and the capacitor Cs coupled to the station 1 until the parameter is within the first pre-determined extent. On the other hand, upon determining that the parameter is within the first pre-determined extent, the processor 904 does not send the command signals to the drivers D1 and D2. When the command signal is not received by the driver D1, the driver D1 does not generate the current signal and the inductance of the inductor Lvs coupled to the station 1 does not change. Similarly, when the command signal is not received by the driver D2, the driver D2 does not generate the current signal and the capacitance of the capacitor Cs coupled to the station 1 does not change.

In a similar manner, the processor 904 receives a measurement of the parameter from the VI probe 110 coupled to the RF transmission line 706B and determines whether the parameter is within a second pre-determined extent. Upon determining that the parameter is not within the second pre-determined extent, the processor 904 sends command signals to the drivers D3 and D4. Upon receiving one of the command signals, the driver D3 generates a current signal to send to the motor M3. The motor M3 operates to change an inductance of the inductor Lvs coupled to the station 2. Similarly, upon receiving another one of the command signals, the driver D4 generates a current signal to send to the motor M4. The motor M4 operates to change a capacitance of the capacitor Cs coupled to the station 2. The change in the inductance of the inductor Lvs coupled to the station 2 and the capacitance of the capacitor Cs coupled to the station 2 changes the parameter measured by the VI probe 110 that is coupled to the output O3. In such a manner, the processor 904 continues to control the inductor Lvs coupled to the station 2 and the capacitor Cs coupled to the station 2 until the parameter is within the second pre-determined extent. On the other hand, upon determining that the parameter is within the second pre-determined extent, the processor 904 does not send the command signals to the drivers D3 and D4. When the command signal is not received by the driver D3, the driver D3 does not generate the current signal and the inductance of the inductor Lvs coupled to the station 2 does not change. Similarly, when the command signal is not received by the driver D4, the driver D4 does not generate the current signal and the capacitance of the capacitor Cs coupled to the station 2 does not change.

Also, the processor 904 receives a measurement of the parameter from the VI probe 110 coupled to the RF transmission line 706C and determines whether the parameter is within a third pre-determined extent. Upon determining that the parameter is not within the third pre-determined extent, the processor 904 sends command signals to the drivers D5 and D6. Upon receiving one of the command signals, the driver D5 generates a current signal to send to the motor M5. The motor M5 operates to change an inductance of the inductor Lvs coupled to the station 3. Similarly, upon receiving another one of the command signals, the driver D6 generates a current signal to send to the motor M6. The motor M6 operates to change a capacitance of the capacitor Cs coupled to the station 3. The change in the inductance of the inductor Lvs coupled to the station 3 and the capacitance of the capacitor Cs coupled to the station 3 changes the parameter measured by the VI probe 110 that is coupled to the output O4. In such a manner, the processor 904 continues to control the inductor Lvs coupled to the station 3 and the capacitor Cs coupled to the station 3 until the parameter is within the third pre-determined extent. On the other hand, upon determining that the parameter is within the third pre-determined extent, the processor 904 does not send the command signals to the drivers D5 and D6. When the command signal is not received by the driver D5, the driver D5 does not generate the current signal and the inductance of the inductor Lvs coupled to the station 3 does not change. Similarly, when the command signal is not received by the driver D6, the driver D6 does not generate the current signal and the capacitance of the capacitor Cs coupled to the station 3 does not change.

Moreover, the processor 904 receives a measurement of the parameter from the VI probe 110 coupled to the RF transmission line 706D and determines whether the parameter is within a fourth pre-determined extent. Upon determining that the parameter is not within the fourth pre-determined extent, the processor 904 sends command signals to the drivers D7 and D8. Upon receiving one of the command signals, the driver D7 generates a current signal to send to the motor M7. The motor M7 operates to change an inductance of the inductor Lvs coupled to the station 4. Similarly, upon receiving another one of the command signals, the driver D8 generates a current signal to send to the motor M8. The motor M8 operates to change a capacitance of the capacitor Cs coupled to the station 4. The change in the inductance of the inductor Lvs coupled to the station 4 and the capacitance of the capacitor Cs coupled to the station 4 changes the parameter measured by the VI probe 110 that is coupled to the output O5. In such a manner, the processor 904 continues to control the inductor Lvs coupled to the station 4 and the capacitor Cs coupled to the station 4 until the parameter is within the fourth pre-determined extent. On the other hand, upon determining that the parameter is within the fourth pre-determined extent, the processor 904 does not send the command signals to the drivers D7 and D8. When the command signal is not received by the driver D7, the driver D7 does not generate the current signal and the inductance of the inductor Lvs coupled to the station 4 does not change. Similarly, when the command signal is not received by the driver D8, the driver D8 does not generate the current signal and the capacitance of the capacitor Cs coupled to the station 4 does not change.

In some embodiments, the first pre-determined extent is different from one or more of the second pre-determined extent, the third pre-determined extent, and the fourth pre-determined extent.

In several embodiments, the first pre-determined extent is the same as the second pre-determined extent, the third pre-determined extent, and the fourth pre-determined extent. In these embodiments, when the first pre-determined extent is the same as the second pre-determined extent, the third pre-determined extent, and the fourth pre-determined extent, the parameter at the outputs O2 through O5 is balanced.

In various embodiments, an inductance of the inductor Lvs of the shunt circuit 542 coupled to the RF transmission line 706A and a capacitance of the capacitor Cs of the shunt circuit 542 coupled to the RF transmission line 706A are modified manually until the parameter measured by the VI probe 110 coupled to the output O2 is within the first pre-determined extent. Similarly, an inductance of the inductor Lvs of the shunt circuit 542 coupled to the RF transmission line 706B and a capacitance of the capacitor Cs of the shunt circuit 542 coupled to the RF transmission line 706B are changed by a person until the parameter measured by the VI probe 110 coupled to the output O3 is within the second pre-determined extent. Also, an inductance of the inductor Lvs of the shunt circuit 542 coupled to the RF transmission line 706C and a capacitance of the capacitor Cs of the shunt circuit 542 coupled to the RF transmission line 706C are controlled manually until the parameter measured by the VI probe 110 coupled to the output O4 is within the third pre-determined extent. Moreover, an inductance of the inductor Lvs of the shunt circuit 542 coupled to the RF transmission line 706D and a capacitance of the capacitor Cs of the shunt circuit 542 coupled to the RF transmission line 706D are modified manually until the parameter measured by the VI probe 110 coupled to the output O5 is within the fourth pre-determined extent.

In some embodiments, inductances of the inductors Lvs and capacitances of the capacitors Cs of the shunt circuits 542 coupled to the RF transmission lines 706A through 706D are changed manually until the parameter measured by the VI probes 110 coupled to the outputs O2 through O5 are balanced to be within the single pre-determined extent, e.g., the first pre-determined extent or the second pre-determined extent or the third pre-determined extent or the fourth pre-determined extent.

Figure 10A:
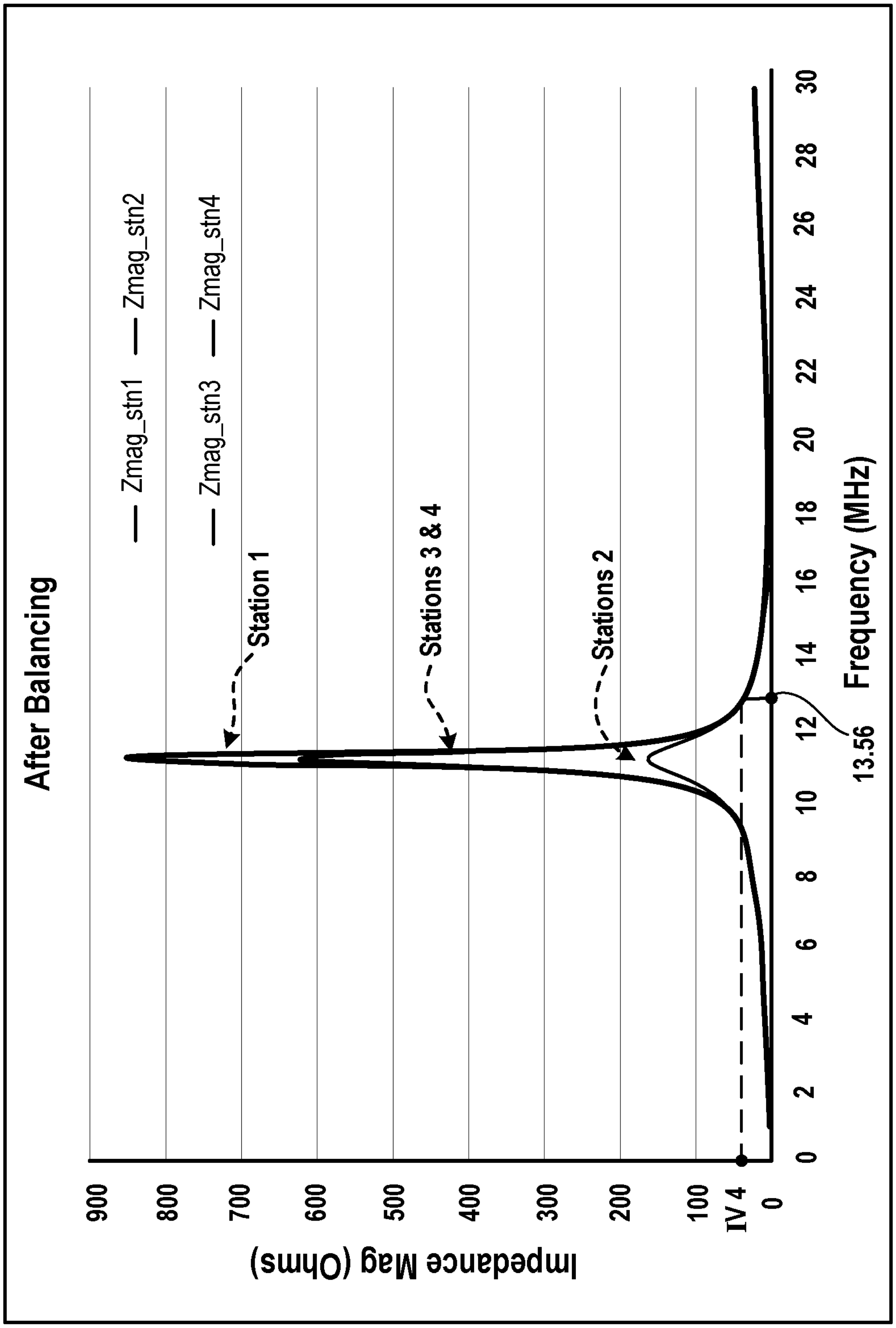
FIG. 10A is an embodiment of a graph to illustrate impedances associated with the stations when shunt circuits coupled to the stations are used to balance a parameter at outputs of a power splitter.

FIG. 10A is an embodiment of a graph 1000 to illustrate impedances associated with parasitic capacitances of the stations 1 through 4 when shunt circuits coupled to the stations 1 through 4 are used to balance the parameter at the outputs O2 through O5. The graph 1000 plots magnitudes of impedance at the outputs O2 through O5 of the power splitter 702 (FIG. 7) on the RF transmission lines 706A through 706D versus frequencies of operation of the RF generator 104 (FIG. 7).

A magnitude of impedance at the outputs O2 through O5 is IV4 when the frequency of operation is 13.56 MHz and when all the shunt circuits coupled to the stations 1 through 4 are balanced. It should be noted that the magnitude IV4 is lower than the magnitudes IV1 and IV3 (FIG. 8B) but is greater than the magnitude IV2 (FIG. 8A).

FIG. 10B is an embodiment of a table 1020 to illustrate balancing of power at the four stations 1 through 4. The power is measured at the outputs O2 through O5 (FIG. 7) of the power splitter 702. It should be noted that power at the outputs O2 through O5 ranges between 576 watts and 593 watts compared to power at the outputs O2 through O5 when the power is not balanced (see FIG. 8E). Although the impedance is reduced at the outputs O2 through O5, power at the outputs O2 through O5 is balanced.

It should be noted that in some embodiments, when the parameter at the outputs O2 through O5 is balanced, an average deposition rate of depositing materials, e.g., oxides, nitrides, carbides, silicon, etc., on wafers 112 (FIG. 7) at the stations 1 through 4 can increase by 10 to 15 percent compared to an average deposition rate of depositing materials on wafers 112 when the shunt circuits are not coupled to the stations 1 through 4.

Embodiments described herein may be practiced with various computer system configurations including hand-held hardware units, microprocessor systems, microprocessor-based or programmable consumer electronics, minicomputers, mainframe computers and the like. The embodiments can also be practiced in distributed computing environments where tasks are performed by remote processing hardware units that are linked through a network.

In some embodiments, a controller is part of a system, which may be part of the above-described examples. Such systems include semiconductor processing equipment, including a processing tool or tools, chamber or chambers, a platform or platforms for processing, and/or specific processing components (a wafer pedestal, a gas flow system, etc.). These systems are integrated with electronics for controlling their operation before, during, and after processing of a semiconductor wafer or substrate. The electronics is referred to as the "controller," which may control various components or subparts of the system or systems. The controller, depending on the processing requirements and/or the type of system, is programmed to control any of the processes disclosed herein, including the delivery of process gases, temperature settings (e.g., heating and/or cooling), pressure settings, vacuum settings, power settings, RF generator settings, RF matching circuit settings, frequency settings, flow rate settings, fluid delivery settings, positional and operation settings, wafer transfers into and out of a tool and other transfer tools and/or load locks connected to or interfaced with a system.

Broadly speaking, in a variety of embodiments, the controller is defined as electronics having various integrated circuits, logic, memory, and/or software that receive instructions, issue instructions, control operation, enable cleaning operations, enable endpoint measurements, and the like. The integrated circuits include chips in the form of firmware that store program instructions, digital signal processors (DSPs), chips defined as ASICs, PLDs, and/or one or more microprocessors, or microcontrollers that execute program instructions (e.g., software). The program instructions are instructions communicated to the controller in the form of various individual settings (or program files), defining operational parameters for carrying out a particular process on or for a semiconductor wafer or to a system. The operational parameters are, in some embodiments, a part of a recipe defined by process engineers to accomplish one or more processing steps during the fabrication of one or more layers, materials, metals, oxides, silicon, silicon dioxide, surfaces, circuits, and/or dies of a wafer.

The controller, in some embodiments, is a part of or coupled to a computer that is integrated with, coupled to the system, otherwise networked to the system, or a combination thereof. For example, the controller is in a "cloud" or all or a part of a fab host computer system, which allows for remote access of the wafer processing. The computer enables remote access to the system to monitor current progress of fabrication operations, examines a history of past fabrication operations, examines trends or performance metrics from a plurality of fabrication operations, to change parameters of current processing, to set processing steps to follow a current processing, or to start a new process.

In some embodiments, a remote computer (e.g. a server) provides process recipes to a system over a network, which includes a local network or the Internet. The remote computer includes a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters are specific to the type of process to be performed and the type of tool that the controller is configured to interface with or control. Thus as described above, the controller is distributed, such as by including one or more discrete controllers that are networked together and working towards a common purpose, such as the processes and controls described herein. An example of a distributed controller for such purposes includes one or more integrated circuits on a chamber in communication with one or more integrated circuits located remotely (such as at the platform level or as part of a remote computer) that combine to control a process on the chamber.

Without limitation, in various embodiments, example systems include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that is associated or used in the fabrication and/or manufacturing of semiconductor wafers.

It is further noted that in some embodiments, the above-described operations apply to several types of plasma chambers, e.g., a plasma chamber including an inductively coupled plasma (ICP) reactor, a transformer coupled plasma chamber, a capacitively coupled plasma reactor, conductor tools, dielectric tools, a plasma chamber including an electron cyclotron resonance (ECR) reactor, etc. For example, one or more RF generators are coupled to an inductor within the ICP reactor. Examples of a shape of the inductor include a solenoid, a dome-shaped coil, a flat-shaped coil, etc.

As noted above, depending on the process step or steps to be performed by the tool, the controller communicates with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

With the above embodiments in mind, it should be understood that some of the embodiments employ various computer-implemented operations involving data stored in computer systems. These operations are those physically manipulating physical quantities. Any of the operations described herein that form part of the embodiments are useful machine operations.

Some of the embodiments also relate to a hardware unit or an apparatus for performing these operations. The apparatus is specially constructed for a special purpose computer. When defined as a special purpose computer, the computer performs other processing, program execution or routines that are not part of the special purpose, while still being capable of operating for the special purpose.

In some embodiments, the operations may be processed by a computer selectively activated or configured by one or more computer programs stored in a computer memory, cache, or obtained over the computer network. When data is obtained over the computer network, the data may be processed by other computers on the computer network, e.g., a cloud of computing resources.

One or more embodiments can also be fabricated as computer-readable code on a non-transitory computer-readable medium. The non-transitory computer-readable medium is any data storage hardware unit, e.g., a memory device, etc., that stores data, which is thereafter be read by a computer system. Examples of the non-transitory computer-readable medium include hard drives, network attached storage (NAS), ROM, RAM, compact disc-ROMs (CD-ROMs), CD-recordables (CD-Rs), CD-rewritables (CD-RWs), magnetic tapes and other optical and non-optical data storage hardware units. In some embodiments, the non-transitory computer-readable medium includes a computer-readable tangible medium distributed over a network-coupled computer system so that the computer-readable code is stored and executed in a distributed fashion.

Although the method operations above were described in a specific order, it should be understood that in various embodiments, other housekeeping operations are performed in between operations, or the method operations are adjusted so that they occur at slightly different times, or are distributed in a system which allows the occurrence of the method operations at various intervals, or are performed in a different order than that described above.

It should further be noted that in an embodiment, one or more features from any embodiment described above are combined with one or more features of any other embodiment without departing from a scope described in various embodiments described in the present disclosure.

Although the foregoing embodiments have been described in some detail for purposes of clarity of understanding, it will be apparent that certain changes and modifications can be practiced within the scope of appended claims. Accordingly, the present embodiments are to be considered as illustrative and not restrictive, and the embodiments are not to be limited to the details given herein, but may be modified within the scope and equivalents of the appended claims.

The invention claimed is:

1. A method for balancing impedances across plasma processing stations, comprising:

receiving a plurality of measurements of a parameter from a plurality of outputs of a power splitter, wherein each of the plurality of outputs is coupled to a respective one of the plasma processing stations;

determining whether the plurality of measurements of the parameter are within a predetermined range; and controlling one of a plurality of shunt circuits until the plurality of measurements are within the predetermined range, wherein each of the plurality of shunt circuits is coupled between a respective one of the plurality of outputs of the power splitter and a respective one of a plurality of electrodes of the respective one of the plasma processing stations.

2. The method of claim 1, wherein said receiving the plurality of measurements of the parameter from the plurality of outputs include receiving a first measurement from a first probe coupled to a first one of the plurality of outputs and a second measurement from a second probe coupled to a second one of the plurality of outputs.

3. The method of claim 2, wherein said determining whether the plurality of measurements of the parameter are within the predetermined range includes determining whether the first measurement lies within the predetermined range and the second measurement lies within the predetermined range.

4. The method of claim 2, wherein said controlling the one of the plurality of shunt circuits includes controlling a capacitance or an inductance or a combination thereof of the one of the plurality of shunt circuits until the first measurement is within the predetermined range.

5. The method of claim 2, wherein the one of the plurality of shunt circuits is a first shunt circuit and the plurality of shunt circuits include a second shunt circuit, wherein said controlling the one of the plurality of shunt circuits includes:

controlling a capacitance or an inductance or a combination thereof of the first shunt circuit until the first measurement is within the predetermined range; and controlling a capacitance or an inductance or a combination thereof of the second shunt circuit until the second measurement is within the predetermined range.

6. The method of claim 1, wherein the plurality of outputs includes a first output and a second output, wherein the first output is coupled via a first radio frequency (RF) transmission line to a first one of the plurality of electrodes of a first one of the plurality of plasma processing stations, and the second output is coupled via a second RF transmission line to a second one of the plurality of electrodes of a second one of the plurality of plasma processing stations.

7. The method of claim 6, wherein the plurality of shunt circuits include a first shunt circuit and a second shunt circuit, wherein the first shunt circuit is coupled to the first RF transmission line and the second shunt circuit is coupled to the second RF transmission line.

8. The method of claim 1, wherein the parameter is voltage, or current, or power, or impedance.

9. The method of claim 1, wherein controlling the one of the plurality of shunt circuits reduces an impedance associated with a parasitic capacitance associated with the respective one of the plasma processing stations.

* * * * *